(12) United States Patent
Bryer

(10) Patent No.: US 6,797,076 B1
(45) Date of Patent: Sep. 28, 2004

(54) SPRAY NOZZLE SYSTEM FOR A SEMICONDUCTOR WAFER CONTAINER CLEANING APARATUS

(75) Inventor: James Bryer, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/658,395

(22) Filed: Sep. 8, 2000

Related U.S. Application Data

(63) Continuation-in-part of application No. 09/113,440, filed on Jul. 10, 1998, now Pat. No. 6,432,214.

(51) Int. Cl.[7] .................................. B08B 3/02
(52) U.S. Cl. ................. 134/33; 134/26; 134/22.18; 134/36; 134/153; 134/902
(58) Field of Search ................. 134/33, 26, 36, 134/22.18, 902, 153

(56) References Cited

U.S. PATENT DOCUMENTS

| | | |
|---|---|---|
| 3,620,234 A | 11/1971 | Everroad |
| 4,027,686 A * | 6/1977 | Shortes et al. ............... 134/33 |
| 4,299,245 A | 11/1981 | Clapper |
| 4,437,479 A | 3/1984 | Bardina et al. |
| 4,736,759 A | 4/1988 | Coberly et al. |
| 4,941,489 A | 7/1990 | Kamimura et al. |
| 5,022,419 A | 6/1991 | Thompson |
| 5,224,503 A | 7/1993 | Thompson et al. |
| 5,238,503 A | 8/1993 | Phenix et al. |
| 5,271,774 A | 12/1993 | Leenaars et al. |
| 5,301,700 A | 4/1994 | Kamikawa et al. |
| 5,363,867 A | 11/1994 | Kawano et al. |
| 5,562,113 A | 10/1996 | Thompson et al. |
| 5,672,212 A | 9/1997 | Manos |
| 5,698,038 A | 12/1997 | Guldi et al. |
| 5,715,851 A | 2/1998 | Jung et al. |
| 5,738,128 A | 4/1998 | Thompson |
| 5,972,127 A | 10/1999 | Thompson et al. |
| 6,096,100 A | 8/2000 | Guldi et al. |
| 6,248,177 B1 | 6/2001 | Halbmaier |
| 6,267,123 B1 | 7/2001 | Yoshikawa |
| 6,322,633 B1 | 11/2001 | Bexten et al. |
| 6,358,328 B1 | 3/2002 | Yang et al. |
| 6,412,502 B1 | 7/2002 | Bexten et al. |
| 6,432,214 B2 * | 8/2002 | Bryer et al. ................. 134/10 |
| 6,446,647 B1 | 9/2002 | Chu et al. |

FOREIGN PATENT DOCUMENTS

| | | |
|---|---|---|
| JP | 61-164225 | 7/1986 |
| JP | 61-166134 | 7/1986 |
| JP | 01-111338 | 4/1989 |
| JP | 01-199431 | 8/1989 |

OTHER PUBLICATIONS

DMS (Dynamic Micro Systems) "Model 300 Fully Automatic Centrifugal Cleaner" Information Sheet, Feb. 22, 1996, 1 page.

* cited by examiner

*Primary Examiner*—Zeinab El-Arini
(74) *Attorney, Agent, or Firm*—Perkins Coie LLP

(57) ABSTRACT

A cleaning system for cleaning boxes or containers used to carry semiconductor wafers has box holder assemblies attached to a rotor within an enclosure. Liquid spray manifolds have one or more spray nozzles that spray at an angle toward or away from the direction of rotation of the rotor, or an angle up or down, rather than straight at the boxes in the box holder assemblies. Improved spray coverage and cleaning is achieved.

29 Claims, 16 Drawing Sheets

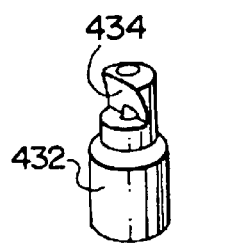
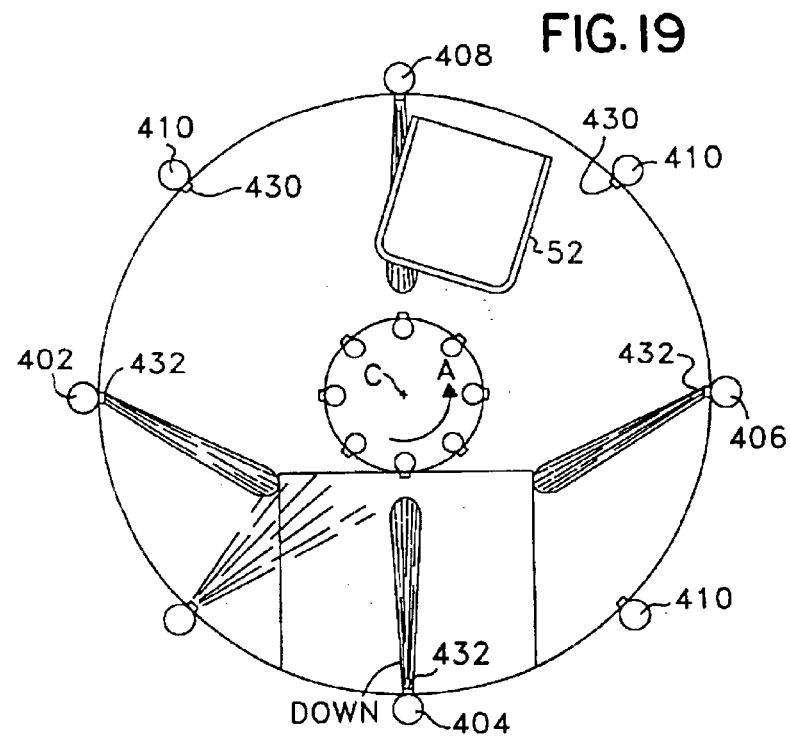
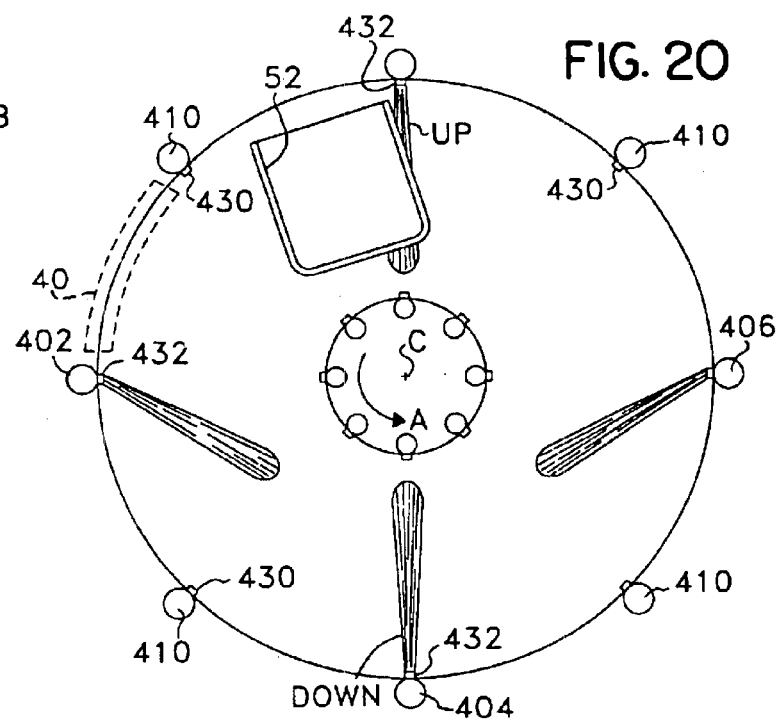

US 6,797,076 B1

SPRAY NOZZLE SYSTEM FOR A SEMICONDUCTOR WAFER CONTAINER CLEANING APARATUS

This Application is a Continuation-in-Part of U.S. patent application Ser. No. 09/113,440, filed Jul. 10, 1998, and now U.S. Pat. No. 6,432,214.

FIELD OF THE INVENTION

The field of the invention is cleaning apparatus for cleaning carriers or containers used to hold and process semiconductor wafers, substrates, flat panel displays and similar flat articles or workpieced requiring low contamination levels.

The processing of semiconductor wafers, substrates, photomasks, flat panel displays, data disks, optical media and other articles relating to the semiconductor industry (collectively referred to here as "wafers") is very sensitive to contamination. These articles or wafers require extremely low contamination levels. Even microscopic particles can cause defects in the articles or the devices made from them. Accordingly, it is necessary to maintain a high level of cleanliness during virtually all manufacturing steps.

Semiconductor wafers are typically processed in batches. Batch handling may occur throughout the entire production process, or for one or more processing steps or related handling operations. Batch processing almost always uses some type of carrier, container, or box (collectively referred to here as a carrier) to hold the wafers. The wafer carriers can be of various designs. In box types of carriers, the wafers are held and enclosed against contamination during travel within the processing facility. Other carriers are open, to allow process liquids or gases to contact the wafers held by the carrier. The wafer carriers must be cleaned, to avoid having particles and contaminants on the carriers contaminate the wafers. However, cleaning wafer carriers can be difficult because they typically have features such as slots, grooves, corners, openings, etc.

One type of wafer carrier is known as the front opening unified pod, or FOUP. A FOUP carrier has a five-sided box with an open front. A door attaches to the front of the box, to seal the box against entry of external contaminants, to help keep the wafers clean. FOUPs or other carriers may be designed to hold 200 mm or 300 mm wafers. Consequently, their larger sizes coupled with the features described above, can make cleaning them even more difficult. The FOUP doors may also be difficult to clean, as they have interior hollow areas which may not be directly accessible via conventional spray cleaning techniques, and because they may tend to trap and hold cleaning liquids. Accordingly, improved apparatus and techniques are needed for cleaning carriers.

Carriers have been successfully cleaned in centrifugal cleaners. See, for example, U.S. Pat. No. 5,738,128 and Ser. No. 09/611,642, filed Jul. 7, 2000, incorporated herein by reference. In the centrifugal cleaners shown in U.S. Pat. No. 5,738,128, the box or carrier is loaded onto a rotor, with the open top or front side of the box facing radially outwardly from the rotor. The box is then sprayed with cleaning fluids, and then with drying gases, while the rotor turns. Centrifugal force helps to remove cleaning fluids from the box, to help dry it. While these techniques have worked well for different types of carriers and boxes, achieving better and more reliable cleaning remains as an engineering design challenge.

SUMMARY OF THE INVENTION

In a first aspect of the invention, an apparatus for cleaning a wafer carrier includes a rotor carrying five sided boxes. The open side of the box faces radially outwardly. Spray manifolds have straight spray nozzles and angled spray nozzles. The straight spray nozzles provide a spray towards the center of the rotor and directly into the box. The angled spray nozzles, oriented towards and/or away from the spin direction, are better positioned to spray leading and/or trailing surfaces, corners, and features of the box. This results in improved cleaning.

In a second aspect, spray manifolds are provided having angle spray nozzles directed at up and/or down angles.

Other and further objects, inventive features, and advantages, will appear hereinafter. The invention resides as well in subsystems and subcombinations of the features described. The features of the various embodiments described may be used with any embodiment, and not only with the specific embodiment on which they are shown or described. It is an object of the invention to provide improved cleaning apparatus and methods.

BRIEF DESCRIPTION OF THE DRAWINGS

In the drawings, wherein the same reference number denotes the same element, throughout the several views:

FIGS. 15–20 are diagrams of spray patterns, nozzle orientation, and container/rotor movement, within the system shown in FIGS. 13 and 14.

FIG. 21 is a perspective view of an angle spray nozzle used in the system shown in FIGS. 13–20.

FIG. 22 is an enlarged section view of the nozzle shown in FIG. 21.

DETAILED DESCRIPTION OF THE DRAWINGS

Figure 1:
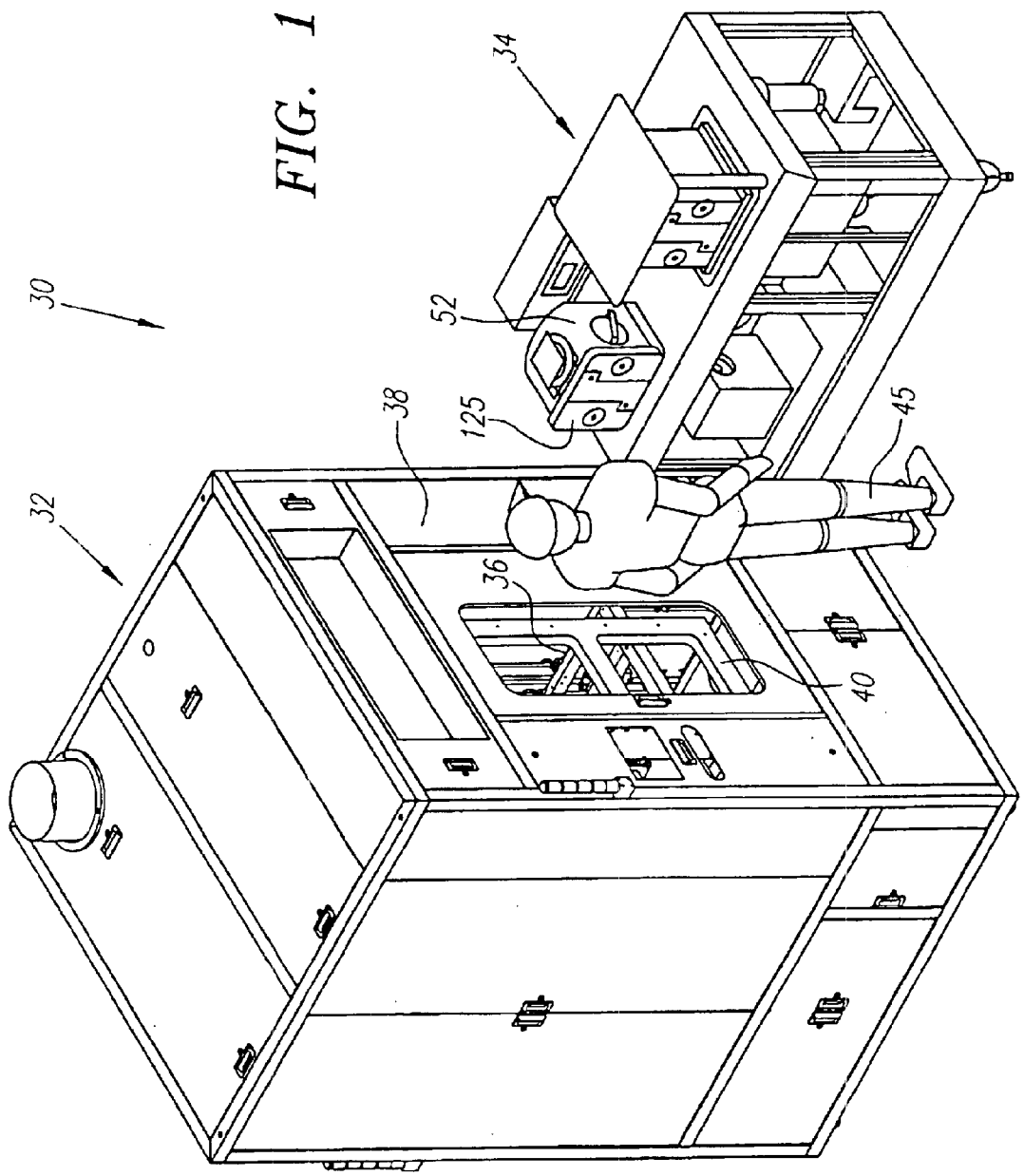
FIG. 1 is a perspective view of a system for cleaning carrier boxes and carrier doors, used in handling semiconductor wafers and similar articles.

Turning now in detail to the drawings, as shown in FIG. 1, a carrier cleaning system 30 includes a centrifugal box cleaner 32, and a door cleaner 34. The door cleaner 34 is preferably located adjacent to the box cleaner 32. A rotor assembly 36 is rotatably supported within an enclosure 38 of the box cleaner 32. The rotor assembly 36 is accessed via an enclosure door 40, which slides open for loading and unloading, and slides closed during cleaning.

Figure 2:
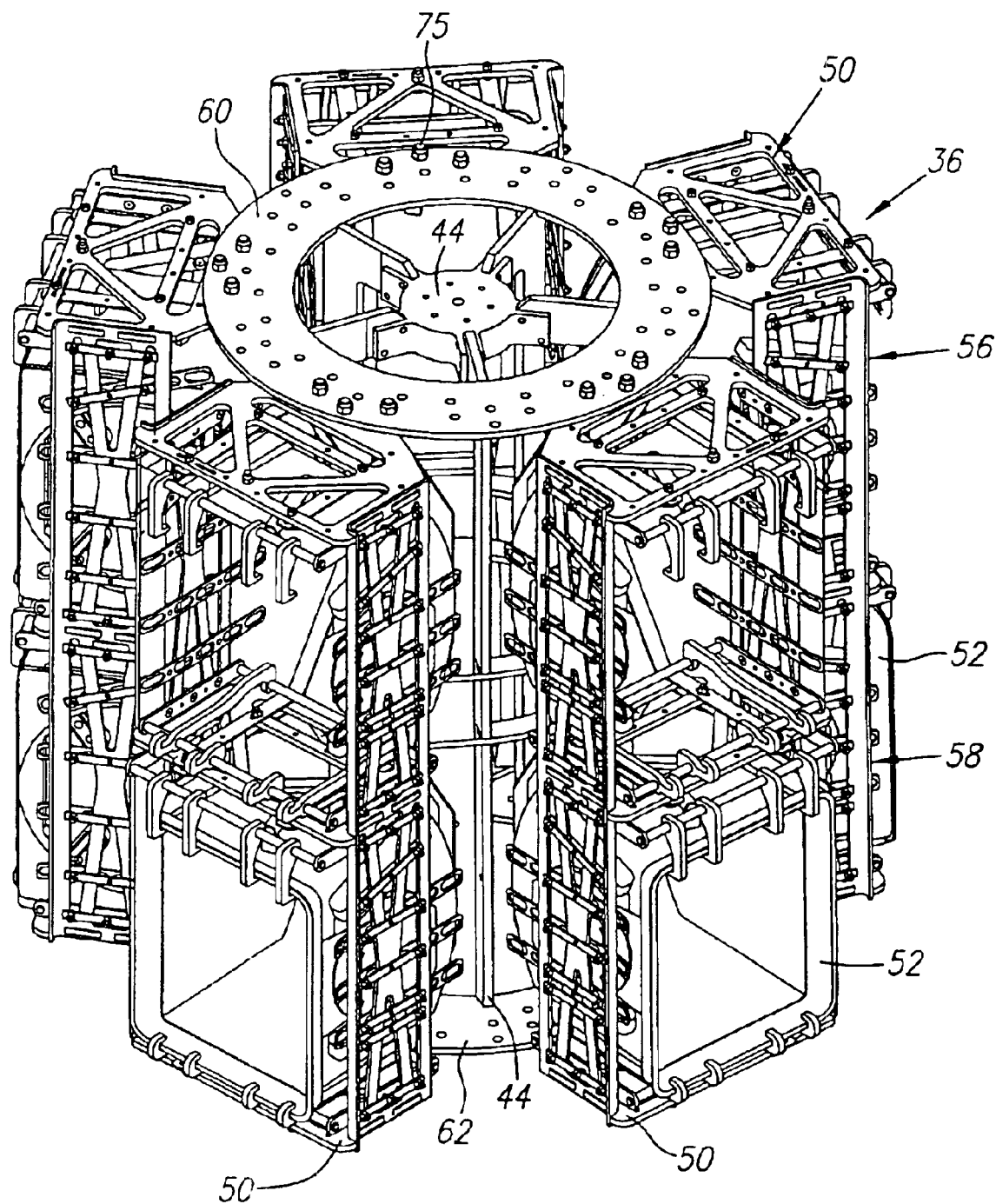
FIG. 2 is a perspective view of the rotor within the box cleaner shown in FIG. 1.
Figure 3:
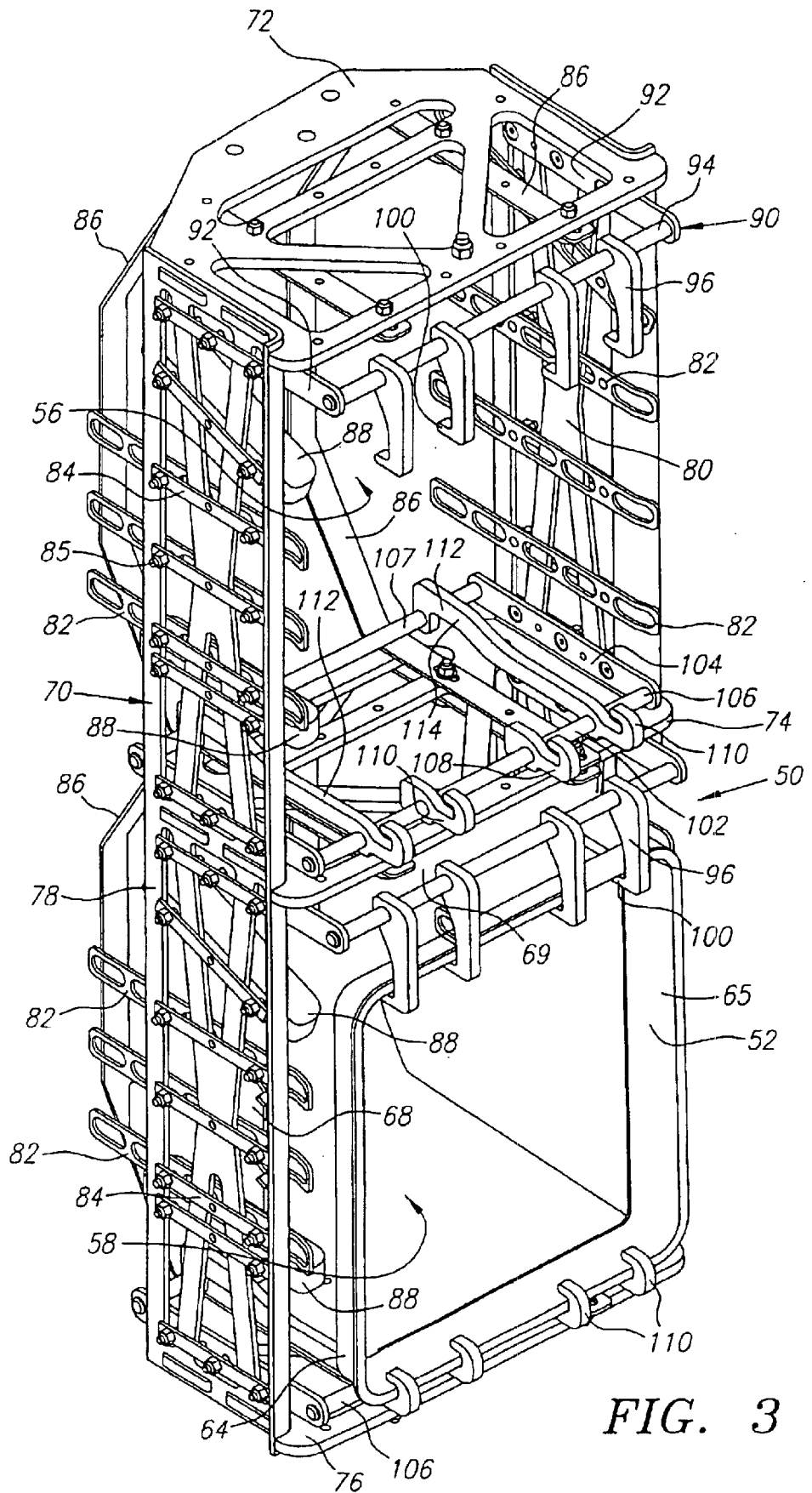
FIG. 3 is an enlarged perspective view of the box holder assemblies shown in FIG. 2.
Figure 4:
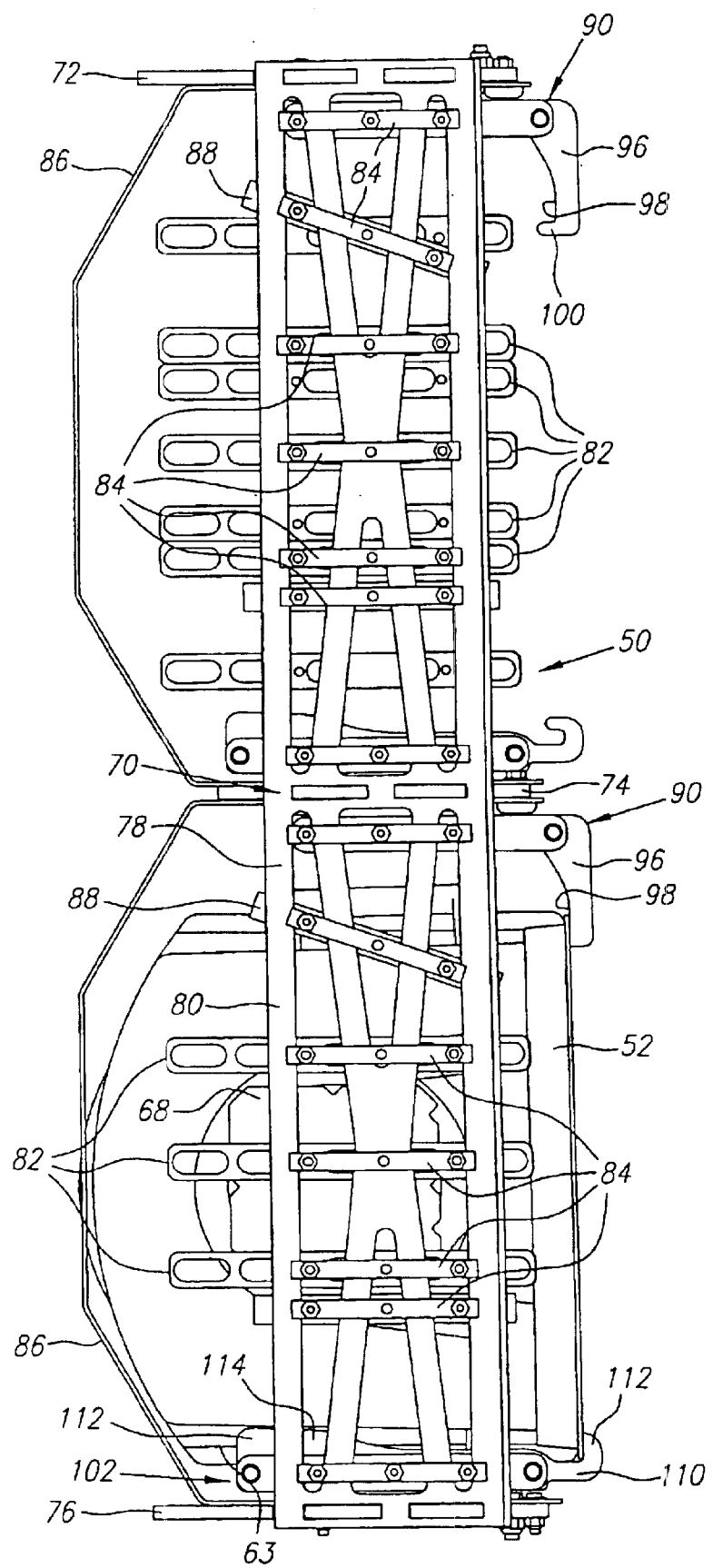
FIG. 4 is a side elevation view thereof.

Turning to FIGS. 2, 3 and 4, box holder assemblies 50 are attached to, and form part of, the rotor assembly 36, within the box cleaner 32. The rotor assembly 36 has a top ring plate 60 and a bottom ring plate 62 attached to a core structure 44. The holder assemblies 50 are rigidly attached to the top and bottom ring plates 60 and 62 via bolts 75.

Referring to FIGS. 3 and 4, each holder assembly 50 has a top plate 72, a middle plate 74, and a bottom plate 76 joined to side plates 78 and 80. An upper box position 56 is formed between the top plate 72 and the middle plate 74. Similarly, a lower box position 58 is formed between the middle plate 74 and the bottom plate 76.

A plurality of side bumpers 82 are attached to the inside surfaces of the side plates 78 and 80, via clamp brackets 84, on the outside surfaces of the side plates 78 and 80, and via fasteners 85 extending through the side bumpers 82, clamp brackets 84, and optionally also through the side plates 78 and 80. Upper and lower misload bumpers 88 are attached to the inside surface of the side plate 78. As shown in FIG. 3, the upper misload bumper 88 in both the upper box position 56 and the lower box position 58 is angled downwardly towards the front opening of each box position 56 and 58, while the lower misload bumper 88 is generally horizontal, in each box position 56 and 58.

As best shown in FIG. 4, a pair of spaced apart rear guides 86 are attached to the top plate 72 and middle plate 74. A pair of spaced-apart rear guides 86 are also similarly attached to the middle plate 74 and bottom plate 76. The rear guides 86 extend rearwardly behind the side plates 78 and 80, in a semi-octagonal configuration.

Referring to FIG. 3, an upper hook assembly 90 has arms 92 attached to the side plates 78 and 80. A crossbar 94 extends between the arms 92. Hooks 96 extend downwardly from the crossbar 94. As better shown in FIG. 4, each hook 96 has a downwardly extending leg 98, and a foot 100 substantially perpendicular to the leg 98, and extending inwardly.

Turning back to FIG. 3, a lower hook assembly 102 similarly has arms 104 attached to the side plates 78 and 80. A front crossbar 106 extends between the arms 104. Center hooks 108 mounted on the crossbar 106 each have an inwardly extending foot 110. Base bars 112, positioned to the outside of the hooks 108, are supported on the front crossbar 106, and also on a rear crossbar 107 attached to the arms 104. Each base bar 112 has a ramp section 114, which ramps upwardly from the front crossbar 106 to the rear crossbar 107, i.e., from front to rear.

In the embodiment shown in FIG. 2, five holder assemblies 50 are equally radially spaced apart on the rotor assembly 36. Each holder assembly 50 has an upper box position 56 and a lower box position 58. Each upper and lower box position 56 and 58 has upper and lower hook assemblies 90 and 102, side bumpers 82, and misload bumpers 88, as described above.

Figure 5:
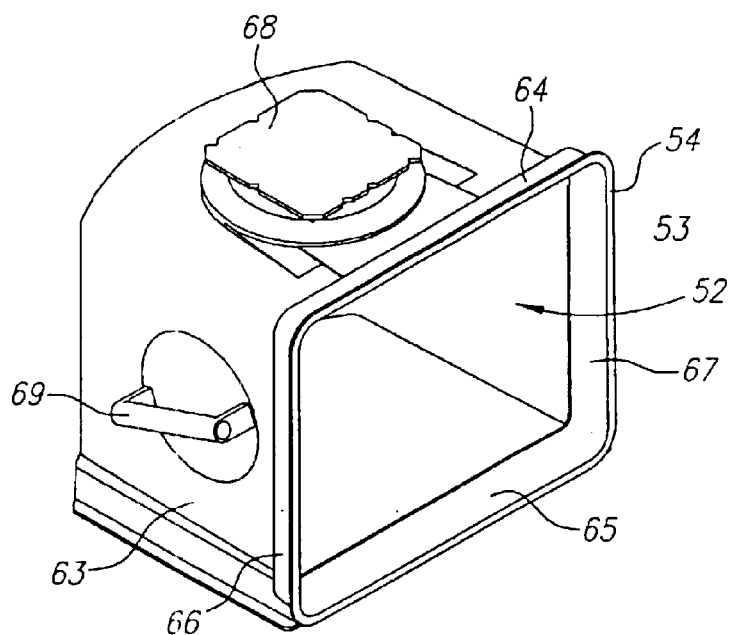
FIG. 5 is a perspective view of a carrier box.

Turning now to FIG. 5, a (FOUP) carrier box 52 has an open front 53 surrounded by a frame or bezel 54. The frame 54 has a top rim 64, a bottom rim 65 a left side rim 66, and a right side rim 67. Handles 69 are attached to side walls 63 of the box 52. A fitting 68 is attached to the top surface of the box 52, for engagement by a robot or other automatic manipulator.

Referring momentarily to FIG. 1, the box cleaner 32 is described above. The door cleaner 34, which together with the box cleaner 32 forms the container cleaning system 30, is now described.

Figure 7:
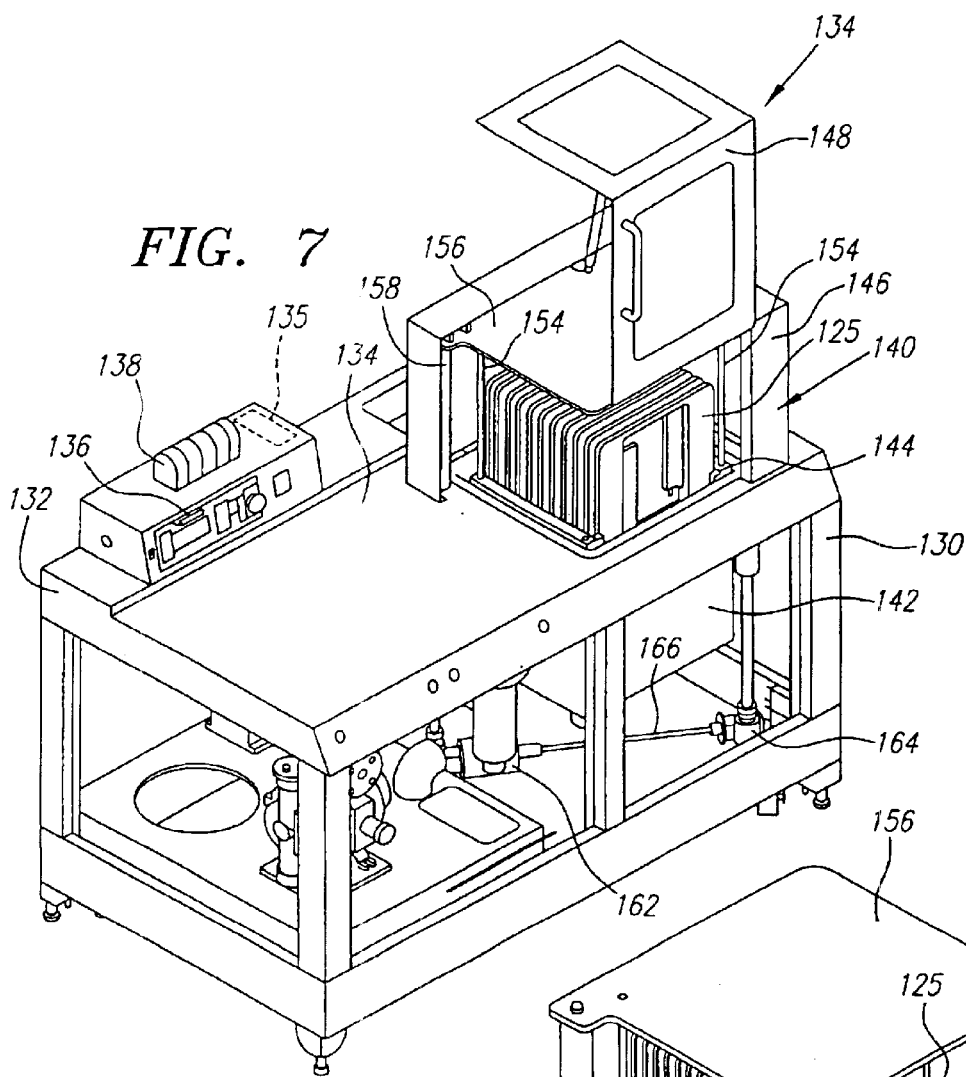
FIG. 7 is a perspective view of the carrier door cleaner shown in FIG. 1.

As shown in FIG. 7, the door cleaner 34 has a frame 130 including a bench top 132 which provides a work space 134. A control panel 136 is located at the back of the bench 132. Indicator lights 138 on the control panel 136 provide a visual indication of status of the door cleaner 34. The door cleaner 34 includes a cleaning unit 140 alongside the work space 134. The cleaning unit 140 has a process tank 142 extending downwardly from the bench surface 132. An enclosure.146 fixed to the top surface of the bench 132 is positioned over and around the tank 142. An enclosure door 148 pivotably attached to the tank enclosure 146 pivots up to allow doors 125 to be loaded into and unloaded from the cleaning unit 140. The enclosure door 148 pivots downwardly to close off the tank 142 from the surrounding environment, during cleaning.

Figure 8:
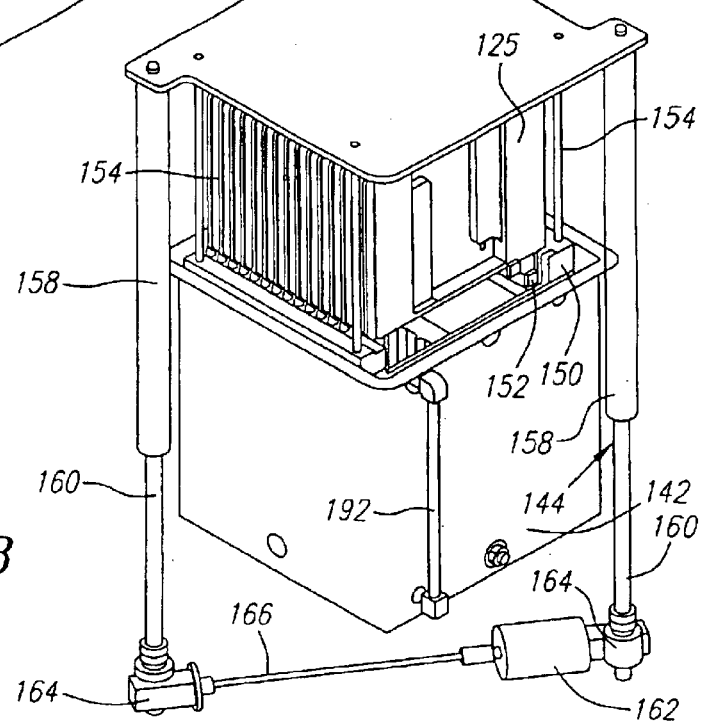
FIG. 8 is a perspective view of the elevator and tank shown in FIG. 7.
Figure 9:
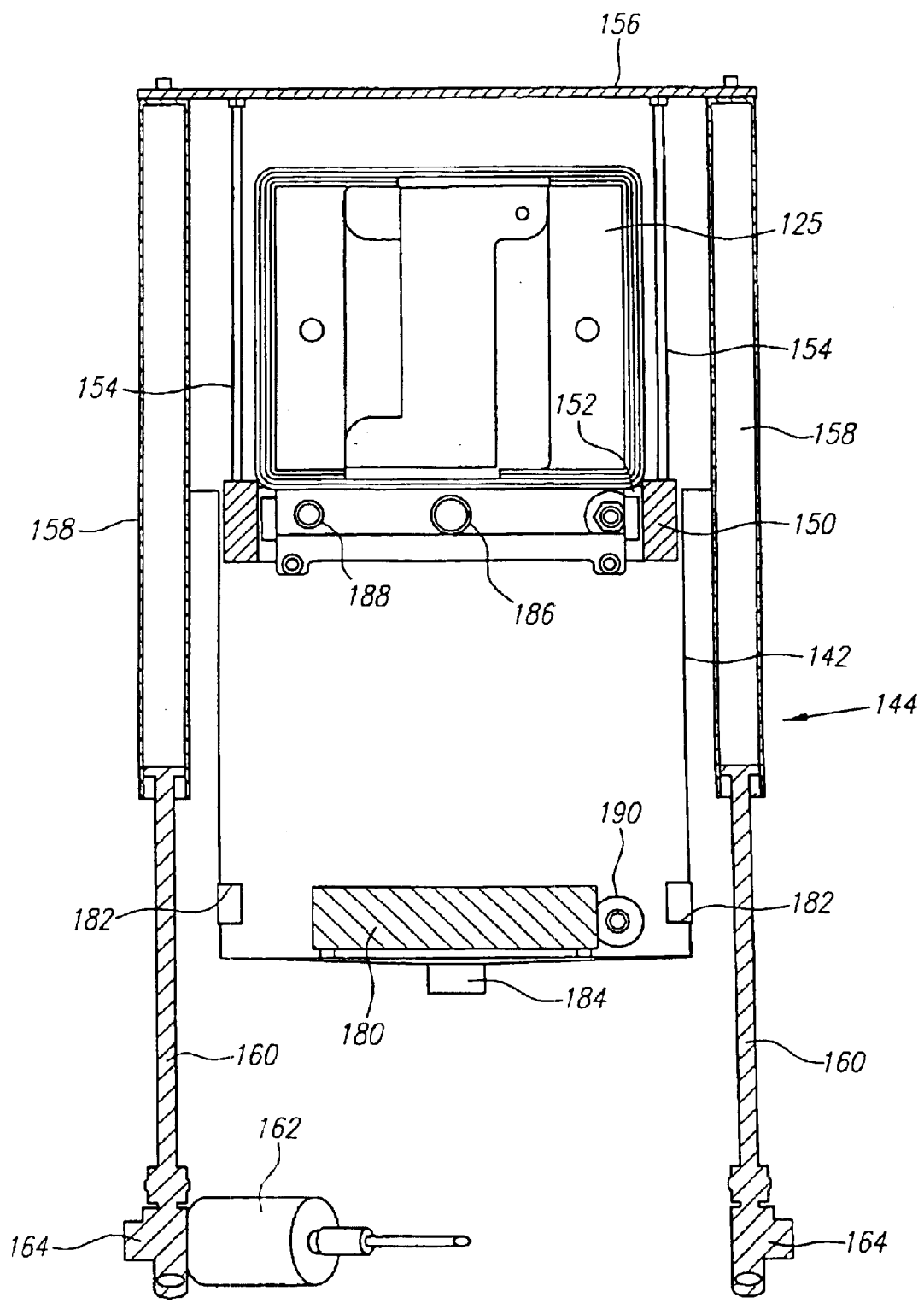
FIG. 9 is a side view thereof, in part section.

As shown in FIGS. 8 and 9, the cleaning unit 140 includes an elevator 144. The elevator has a base 150. The doors 125 are supported on the base 150 between door holder tabs 152, which hold the doors 125 upright and slightly spaced apart, on the base 150. Lift rods 154 extend upwardly from the base 150 and are attached to a tank lid 156. The tank lid 156 is in turn supported on lift tubes 158 at opposite diagonal corners. The lift tubes 158 have internal threads engaged over lead screws 160. The lead screws 160 are rotated via an elevator motor 164 turning a driveshaft 166 through right angle drives 164. As shown in FIG. 9, an ultrasonic transducer 180 is located at the bottom of the tank 142. An interlock prevents movement of the elevator when the enclosure door 148 is open.

Figure 10:
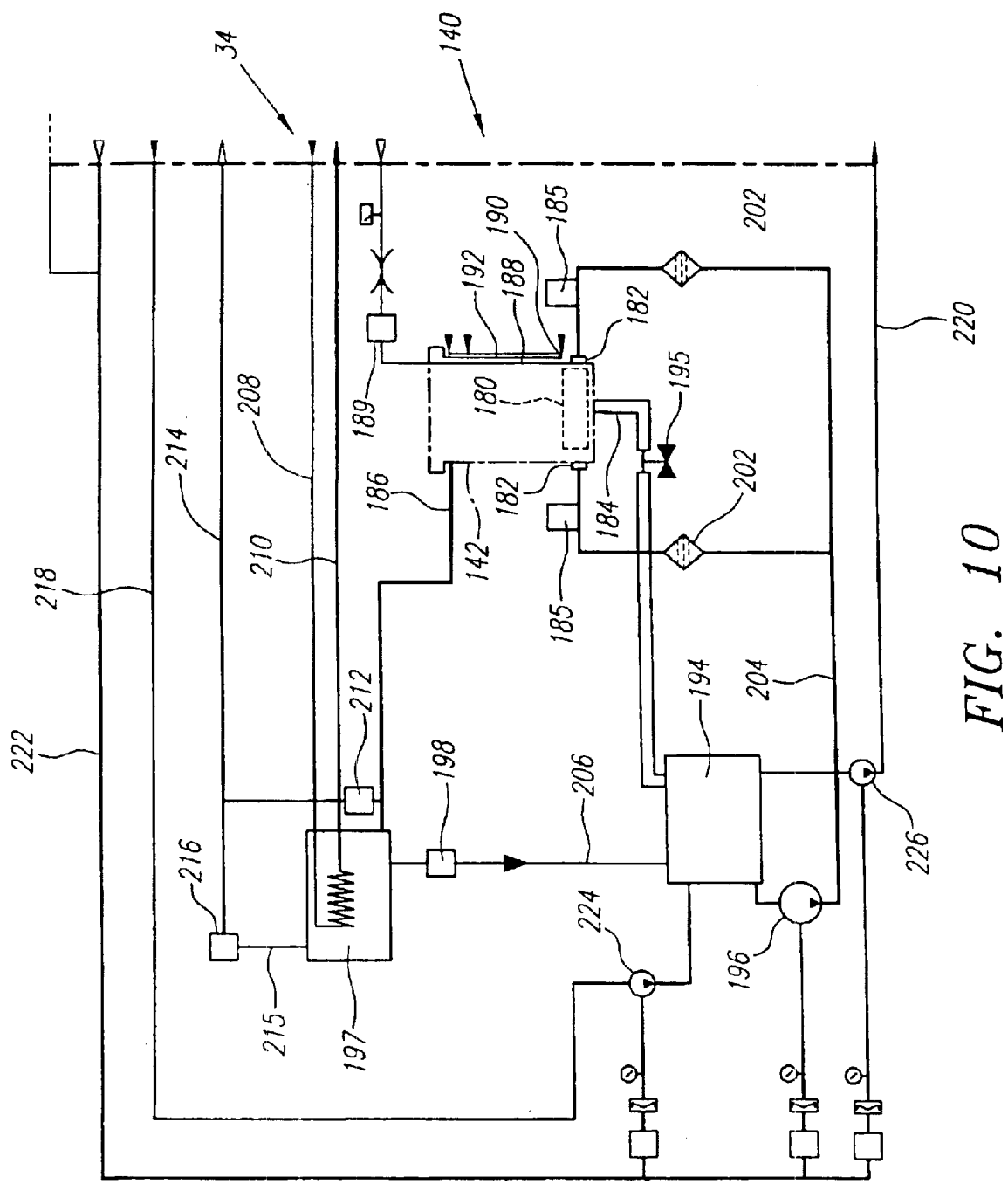
FIG. 10 is a schematic view of the door cleaner shown in FIG. 7.

As shown in FIGS. 9 and 10, a drain line 184 at the bottom of the process tank 142 connects to a reclaim tank 194 under the bench 132 on the frame 130. A fluid fill line 204 runs from the reclaim tank 194 to a delivery pump 196, then through parallel filters 202 and into fill ports 182 at the bottom of the process tank 142. A drain valve 195 controls flow from the drain 184 into the reclaim tank 194. A level sensing entry port 190 connects the process tank 142 to a level sensing tube 192 extending upwardly alongside the tank for sensing fluid level within the tank 142.

A tank vapor exhaust line 186 extends from the top of the tank 142 to an exhaust valve 212, which allows tank exhaust to flow out via an exhaust line 214, or into a vapor condenser 197. Chilled water supply and return lines 208 and 210 connect the vapor condenser 197 to a source of chilled water. A condensate return line 206 runs from the vapor condenser 197 through a breather valve 198 into the reclaim tank 194. A chemical solution supply line 218 connects into the reclaim tank 194 through a fill pump 224. A clean dry air supply line 222 connects into the fill pump 224, the delivery pump 196, and to a drain pump 226 connecting into a chemical solution drain 220, to drive the pumps pneumatically. Alternatively, electrically powered pumps may be used. A vapor condenser exhaust line 215 extends out of the vapor condenser 197, through a condenser exhaust valve 216 and into the exhaust line 214.

A nitrogen purge system 188 provides nitrogen gas through a purge valve 189, to purge the process tank 142 and the lines connecting to the tank. Via use of the nitrogen purge system 188, and the valves 212, 198, 189 and 216, ambient air and humidity can be purged from the cleaning unit 140. Purging reduces or eliminates condensed water vapor in the cleaning unit 140.

A computer controller 135 is linked to the various valves, pumps, sensors, and other components to control operations of the door cleaner 34.

Referring back to FIG. 1, in use, boxes 52 to be cleaned are transported to the container cleaning system 30. A system operator 45 typically lifts a box 52 from a cart and places the box onto the work space 134 of the door cleaner 34. The operator 45 then removes the door 125, and loads the door onto the base 150 of the elevator 144 in the door cleaner 34.

To then load the box 52 into the box cleaner 32, the operator 45 turns the rotor assembly 36, via a control panel, until an empty holder assembly 50 is aligned with the opening of the enclosure door 40. The enclosure door slides open and closed automatically via operator control of the control panel.

Figure 6:
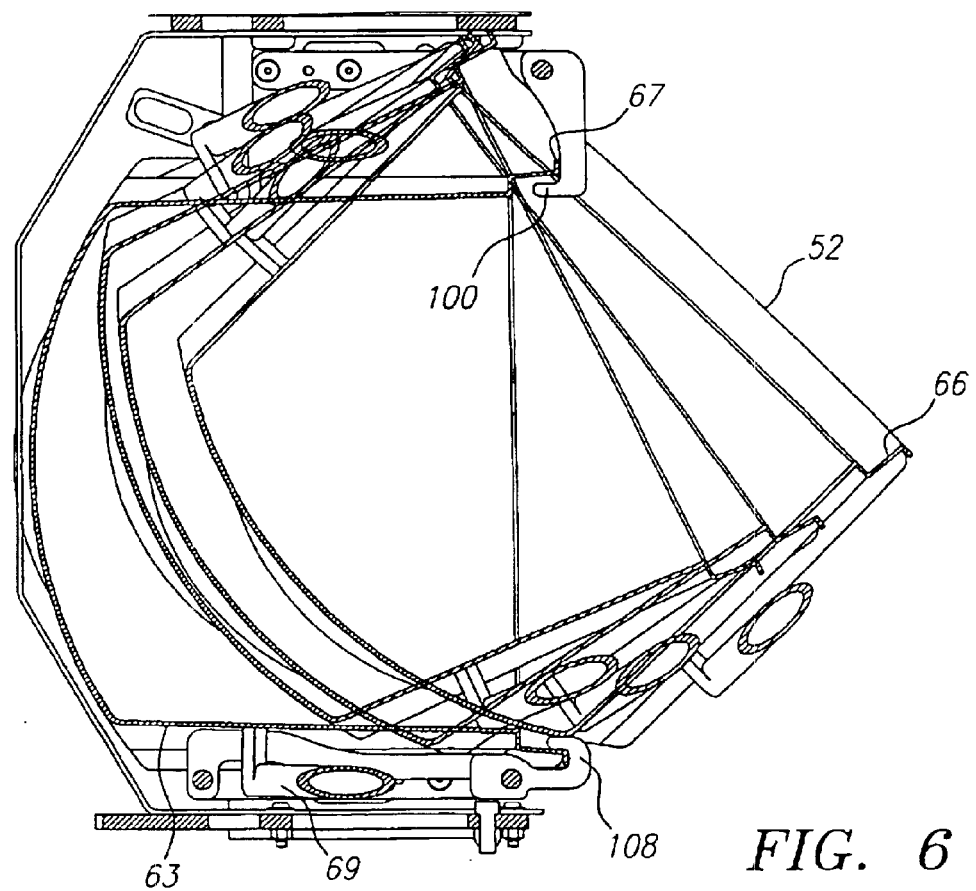
FIG. 6 is a side view, in part section, showing the load sequence of the box shown in FIG. 5, into the holder assembly shown in FIGS. 3 and 4.

Referring to FIG. 6, the operator turns the box 52 so that the right side rim 67 is on top. The operator 45 then moves the box 52 into the open box position 56 or 58, with the right side rim 67 of the box 52 positioned above and behind the hooks 96. The operator 45 then continues to move the box 52 into the box position 56 or 58, by moving the box 52 through the sequence shown in FIG. 6. After the left side rim 66 of the frame 54 of the box 52 moves behind the lower hooks 108, the operator 45 moves the box 52 downwardly, so that, as shown in FIGS. 3, 4 and 6, the feet 100 on the upper hooks 96 extend under the rim 67, and the feet 110 of the lower hooks 108 extend over and engage the rim 66 of the box 52.

Referring to FIG. 6, during the loading sequence, the ramp section 114 of the base bars 112 helps to guide the box 52 into the correct position. The rear guides 86 also help to guide the box 52 into place, by preventing the box from moving too far back in the holder assembly 50. The side bumpers 82 help to guide the box 52 laterally into place. The misload bumpers 88 prevent the box 52 from being loaded into the holder 50, unless the box 52 is properly oriented. The components of the holder 50 which contact the box 52 are preferably made of materials which do not generate excessive particles, via abrasion, etc.

Following the steps described above, the operator 45 continues loading boxes 52 into empty box positions 56 and 58. The doors 125 removed from the boxes are correspondingly loaded onto the base 150 in the door cleaner 34. When all positions are loaded with a box 52, or when there are no further boxes to be cleaned, the operator 45 closes the enclosure door 40 and initiates the cleaning sequence. The rotor assembly 36 spins and cleaning fluids are sprayed onto the boxes 52. Drying gases are then used to dry the boxes 52, as described, for example, in U.S. Pat. No. 5,738,128. After the boxes 52 have been cleaned and dried, they are unloaded and removed from the box cleaner 32 following the reverse of the sequence of steps described above.

As each door 125 is removed from a box 52, the operator 45 manually places the door 125 onto the base 150 in the cleaning unit 140 of the door cleaner 34. The doors 125 are held vertically upright via the holder tabs 152 on the base 150. The process tank 142, at this time, is empty (filled with ambient air). In the embodiment shown, the cleaning unit 140 has a ten-door capacity. The doors 125 are spaced slightly apart by the holder tabs 152.

With the base loaded with doors, the operator 45 initiates the cleaning sequence using the control panel 136. The enclosure door 148 is closed. The elevator motor 162 is energized, lowering the base 150 and doors 125 into the tank 142. With the elevator 144 fully lowered, the tank lid 156 seals against the surrounding top surface of the bench 132. This provides a sealed cleaning unit 140, which advantageously keeps the costly cleaning fluid in, and keeps ambient air and humidity out.

The nitrogen purge valve 189 is opened. Nitrogen flows into the tank to purge atmospheric air. As this occurs, the condenser exhaust valve 216 is momentarily opened to exhaust atmospheric air. After atmospheric air is purged, the valves 189 and 216 are closed.

The tank 142 is filled with fluid by opening the breather valve 198, and the tank fill valves 185. The delivery pump 196 is switched on, and fluid is pumped from the reclaim tank 194 through the fill lines 204, filters 202, valves 185, and into the tank 142 via the fill ports 182. The cleaning fluid is preferably hydrofluoroether (HFE) ($C_4F_9OCH_3$, Methyl Nonafluorobutyl Ether), available from 3M Corporation, St. Paul, Minn., U.S.A.

The ultrasonic transducer 180 is energized. The doors 125 are ultrasonically cleaned in the tank 142. After cleaning is completed, the breather valve 198 and the drain valve 195 are opened. The fluid flows from the process tank 142 back into the reclaim tank 194, via gravity.

The foregoing steps of filling the process tank 142, ultrasonically cleaning, and draining the process tank are advantageously repeated for a desired number of cycles.

The HFE is condensed in a reclaim cycle. with the exhaust valve 212 closed, the condenser exhaust valve 216, and the nitrogen purge valve 189 are opened for a predetermined interval and are then closed. Chilled water runs through the vapor condenser 194. Condensed vapor drains back into the reclaim tank 194 through the condensate return line 206. Uncondensed vapor is exhausted through the exhaust line 214.

The elevator motor 162 is then energized in the reverse direction to raise the base 150 back up until it is about at the same level as the bench 132. This unseals the process tank. The tank enclosure door 148 is opened and the box doors 125 are removed from the base. Optionally, each door 125 may be reinstalled onto a box 52 on the work space 134, as the cleaned boxes 52 are removed in sequence from the box cleaner 32. Via appropriate sequencing, each door 125 can be reinstalled onto the specific box 52 which it originally was provided with.

To process the next batch of doors, the steps described above are repeated. The Nitrogen purge is preferably used between each batch of doors to keep condensed water out of the tanks and pipes.

Figure 11:
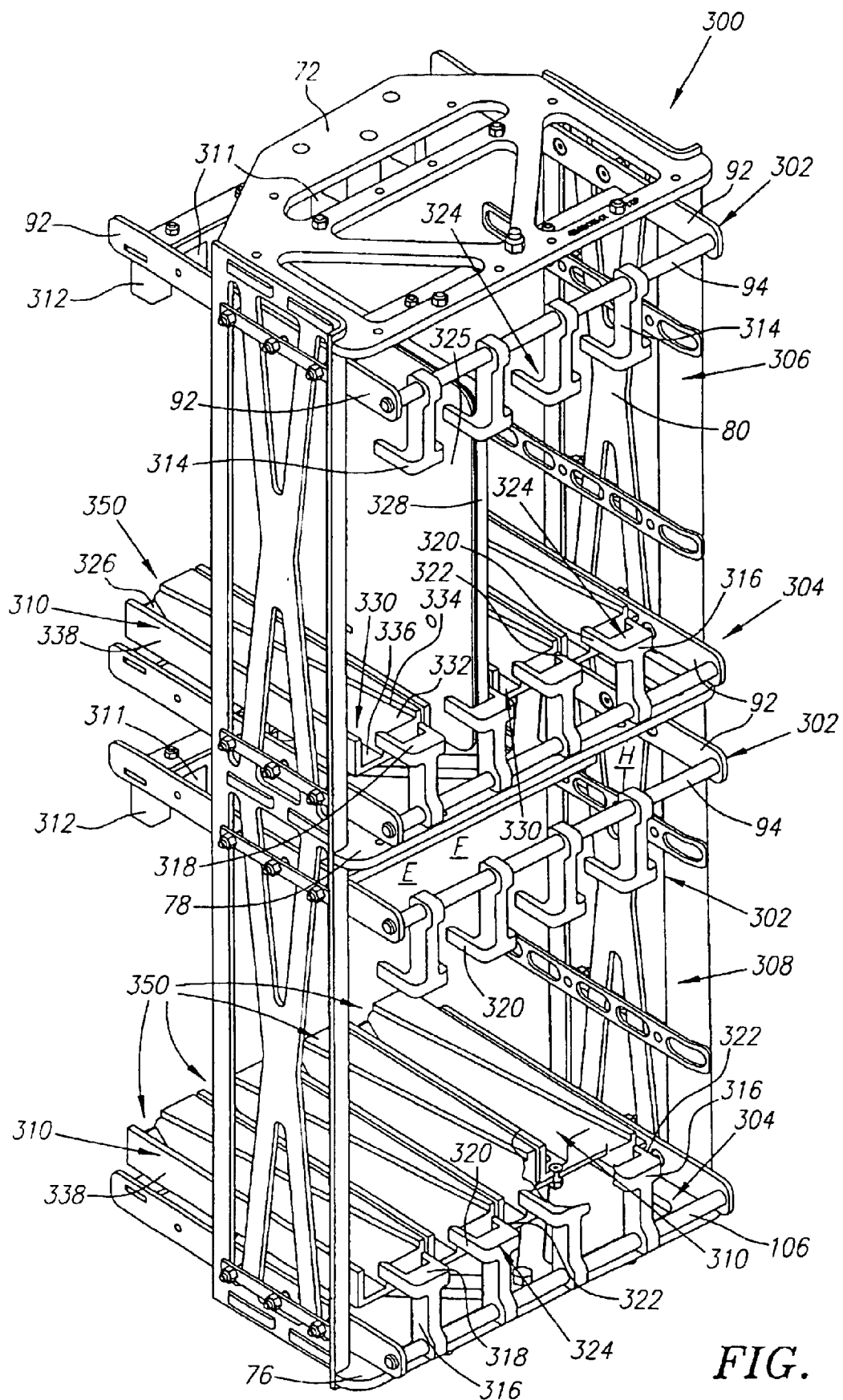
FIG. 11 is a perspective view of a box door holder assembly for use with the rotor shown in FIG. 2.
Figure 12:
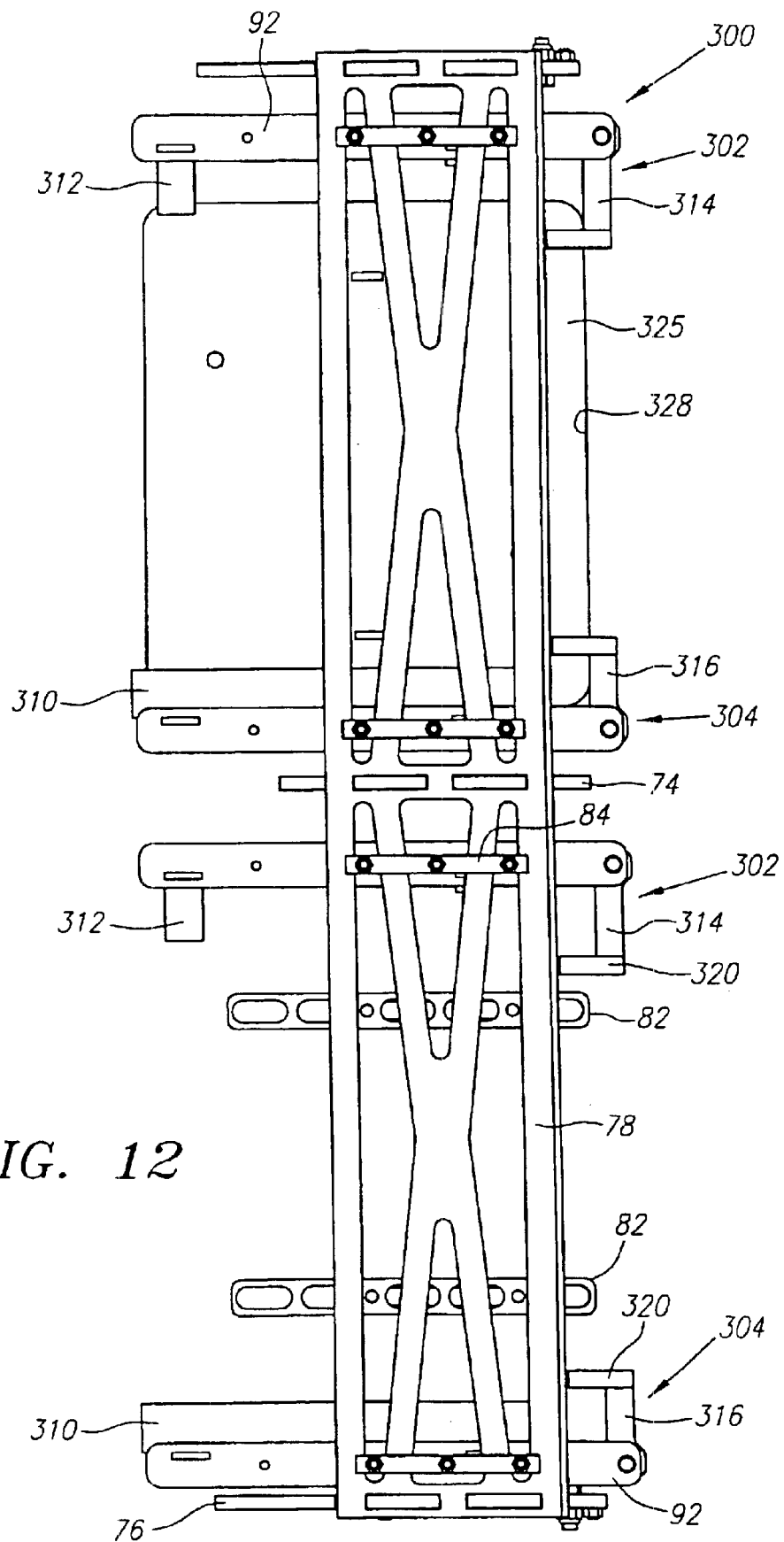
FIG. 12 is a side view thereof.

Certain carriers or boxes have doors which can be cleaned in a centrifugal cleaner. Referring to FIGS. 11 and 12, a door holder assembly 300 is provided on the rotor assembly 36, in place of one of the box holder assemblies 50, to form a modified carrier cleaning system which cleans both boxes and doors within the box cleaner 32. In such a system, the box cleaner 32 and its methods of use may be the same, as described above in connection with FIGS. 1–6, and with the separate box door cleaner described above with reference to FIGS. 7–10 not necessarily used.

The door holder assembly 300 has a middle plate 74, side plates 78 and 80, arms 92, upper cross bars and lower cross bars 106, as well as other components similar to the box holder assemblies 50, as shown in FIGS. 3 and 4.

Referring to FIGS. 2, 11 and 12, the door holder assembly 300 is rigidly attached to the top and bottom ring plates 60 and 62 of the rotor assembly 36, via bolts 75 extending through the top plate 72 and bottom plate 76 of the door holder assembly 300.

Referring to FIG. 11, the door holder assembly 300 has an upper compartment 306 and a lower compartment 308, generally separated by the middle plate 74. Each compartment 306 and 308 has an upper hook assembly 302 and a lower hook assembly 304.

Each upper hook assembly 302 includes a plurality of upper door hooks 314 and lower door hooks 316, preferably evenly spaced apart. Each of the upper and lower door hooks 314 and 316 has a fork head 318 including a long arm 320 and a short arm 322, forming a fork slot 324 between them.

Each of the compartments 306 and 308 preferably has four holding positions 350, with the door holding positions in the upper compartment indicated by A, B, C, and D, and with the door holding positions in the lower compartment indicated by E, F, G, and H. The door holding positions are preferably the same. In FIG. 11, a box door 325 is shown installed in the door holding position B.

A door guide 312 at the top back position of each of the compartments 306 and 308 has corner slots 311 which the upper back corner of the door 325 fits into, when the door 325 is installed into a door holding position. The door guide 312 helps to laterally support the doors (e.g., to hold the doors against side to side movement).

A door block 310 is aligned with a pair of upper and lower door hooks 314 and 316, at each door holding position 350. Referring still to FIG. 11, each door block 310 has a support wall 338 and an angle wall 334 extending at an acute angle to the support wall 338. A guide step 332 extends inwardly from the angle wall 334 towards the support wall 338. The guide step 332 is spaced apart from the support wall 338 by a slot bottom 336, with the guide step 332, slot bottom 336, and support wall 338 forming a guide slot 330.

Within each door holding position A-H, the fork slot 324 in the upper door hook 314, and in the lower door hook 316, is aligned with the guide slot 330 in the door block 310. The upper door hooks 314 are spaced apart from each other by a dimension which allows the door 325 to pass between them. The lower door hooks 316 are similarly spaced apart.

In use, to load doors 325 into the door holder assembly 300 on the rotor assembly 36, the enclosure door 40 is opened and the rotor assembly 36 is indexed or rotated until the door holder assembly 300 moves into alignment with the enclosure door 40. The doors 325 are then loaded into the door holder assembly 300 by hand.

Specifically, an operator moves a door 325 between the hooks 314 and 316, with the door 325 being guided radially inwardly (towards approximately the center of the rotor) at an acute angle to a radius of the rotor, by the angle guide wall 334. When the front edge 328 of the door 325 clears the short arm 322 of the hooks 314 and 316, the front edge 328 of the door 325 is then moved laterally (to the left in FIG. 11), causing the door 325 to move off of the guide step 332 and into the guide slot 330. The door 325 is then also aligned with the fork slots 324 in the door hooks 314 and 316. The operator then pulls the door 325 slightly forward, so that the front edge 328 of the door moves into the fork slots 324 and contacts the fork heads 318 of the door hooks 314 and 316.

The door 325 is then restrained against movement, during rotation of the rotor assembly 36, by the door hooks 314 and 316 (which prevent outward radial movement). The door 325 is also restrained against lateral movement, as the bottom edge of the door in the guide slot 330 is laterally restrained between the support wall 338 and the guide step 332. The top back corner of the door 325 is also laterally supported with the corner slot 311 of the door guide 312. A backstop 326 at the back end of the door block 310 prevents the door 325 from moving too far inwardly, during installation.

Using the sequence described above, the door holder assembly 300 is loaded with doors 325, typically with four doors in the upper compartment 306, and four doors in the lower compartment 308. Referring momentarily to FIG. 2, as the door holder assembly 300 replaces one of the box holder assemblies 50, the rotor assembly 36 has four box holder assemblies 50, each carrying two boxes, for a total of eight boxes, and with the door holder assembly 300 carrying eight doors. As a result, eight boxes along with their doors can be cleaned in a single cycle of the cleaning system.

The doors 325 are unloaded from the door holder assembly 300 using the reverse of the sequence of steps described above.

Due to the larger size of the boxes or containers 52 shown in FIG. 5, and the geometry of the containers 52 when supported in the holder assemblies or ladders 50, conventional spray configurations, such as described in U.S. Pat. No. 5,738,128, incorporated herein by reference, have difficulty in adequately cleaning all surfaces of the containers or boxes 52 on the rotor assembly 36.

Figure 13:
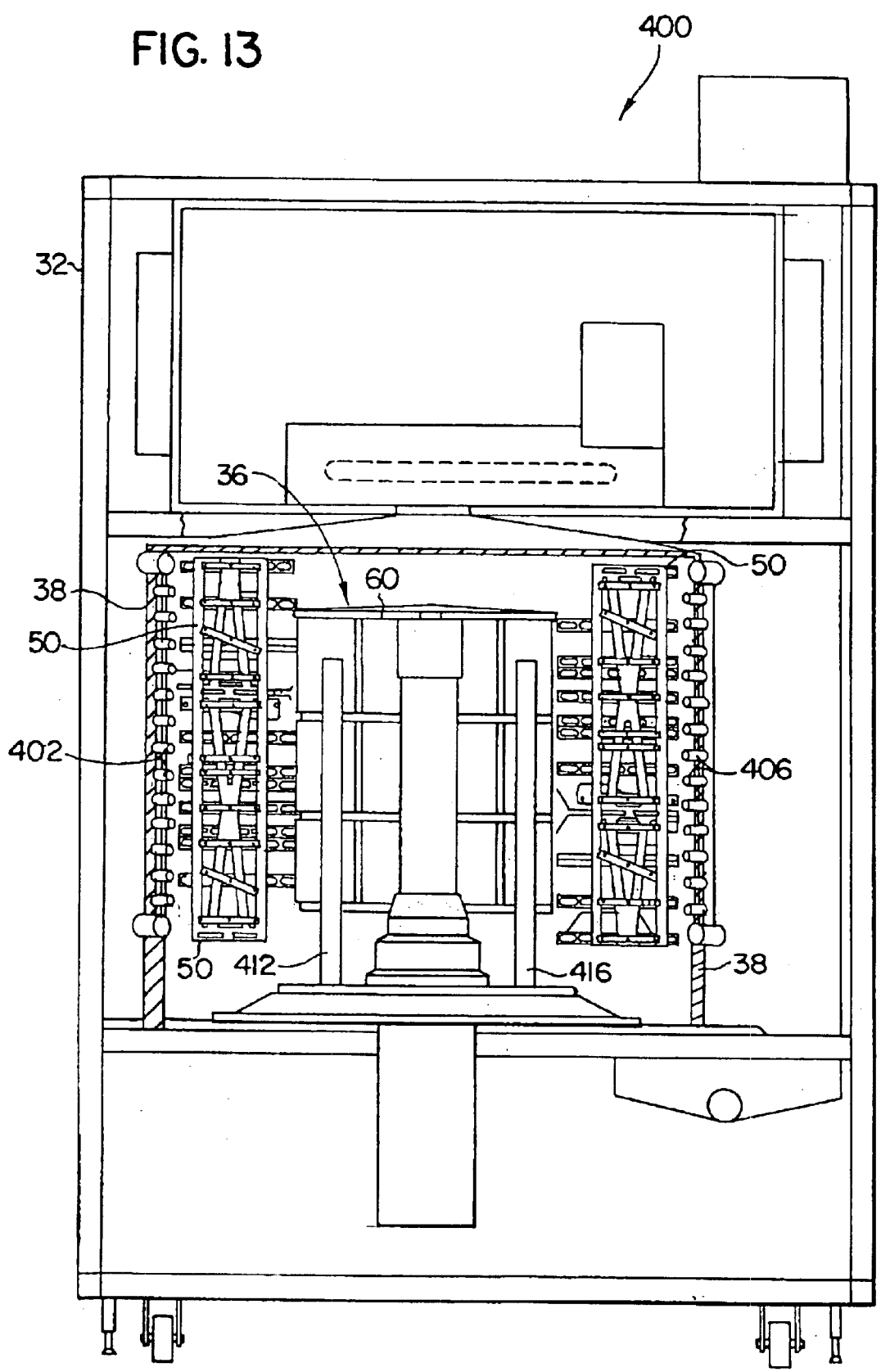
FIG. 13 is a side view of an alternative system similar to the system shown in FIGS. 1–6, but having improved spray nozzle configurations.
Figure 14:
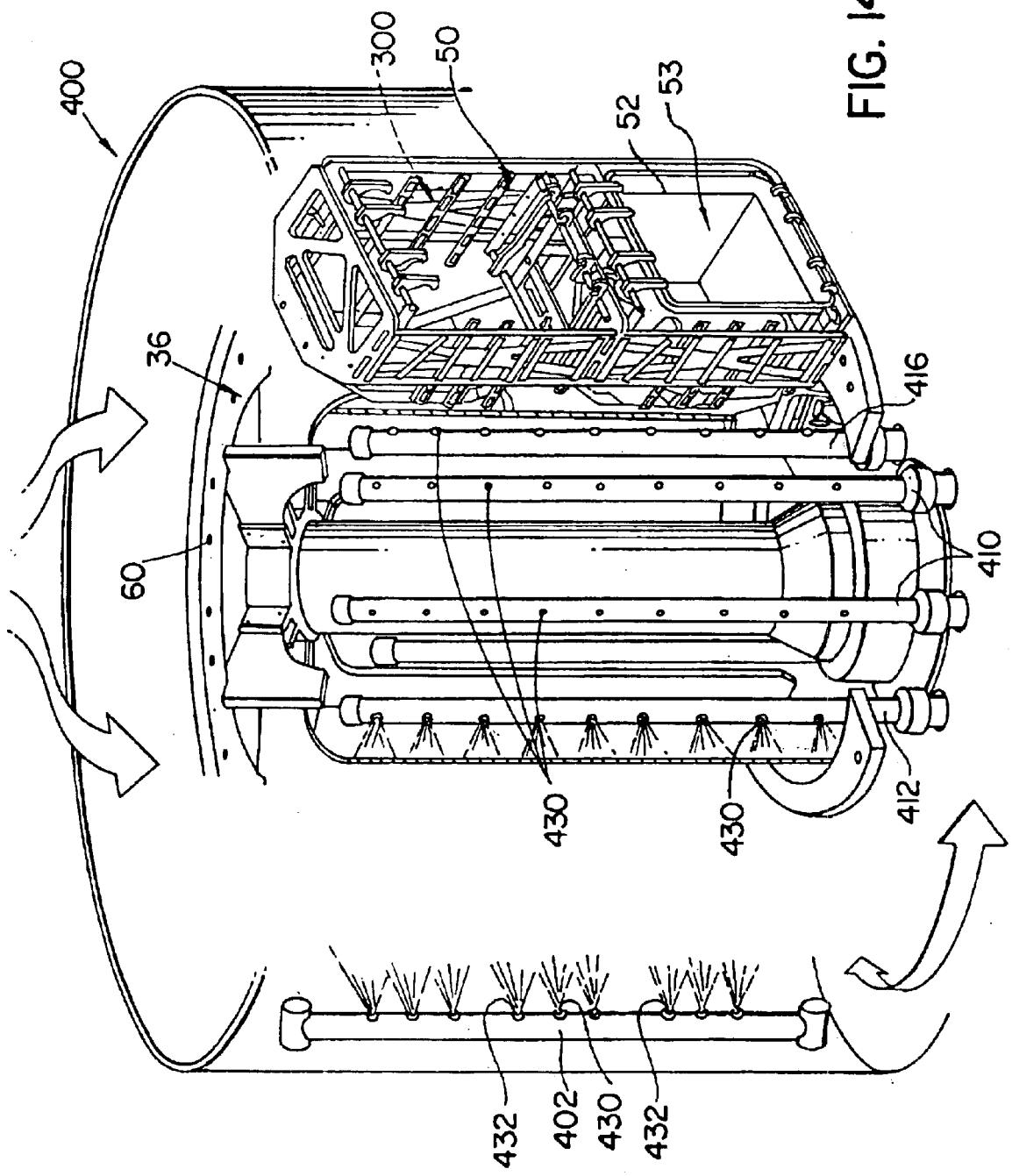
FIG. 14 is a perspective view of the enclosure, rotor and spray manifolds of the system shown in FIG. 13.
Figure 15:
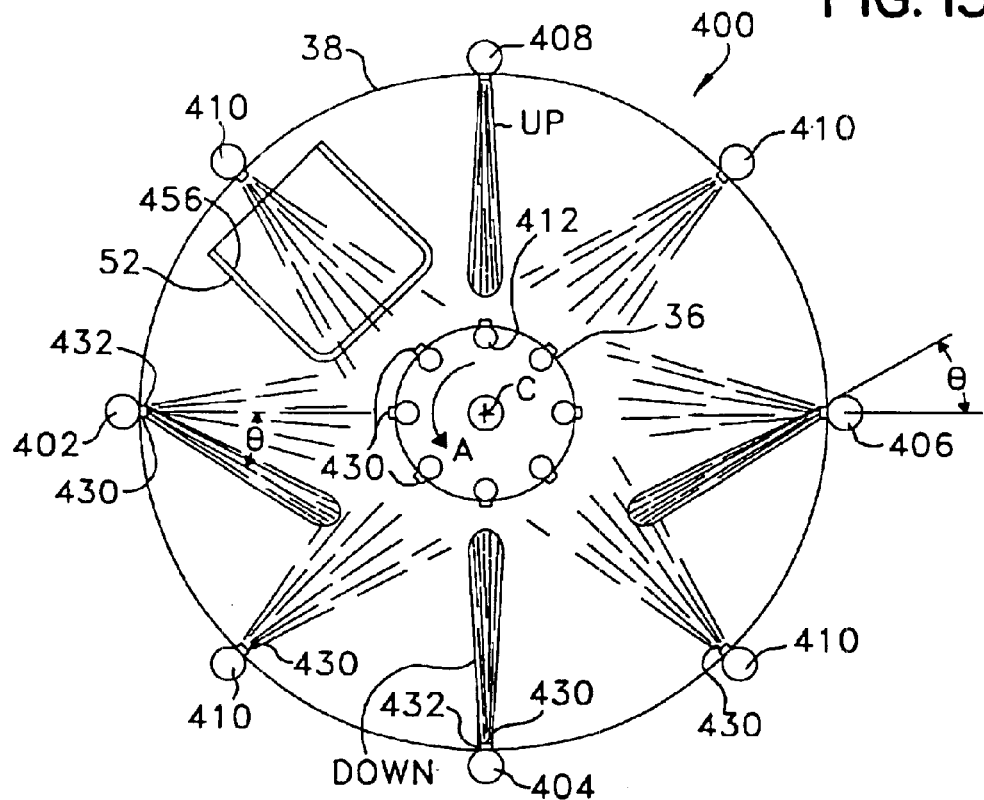

Referring to FIGS. 13, 14 and 15, in an improved centrifugal box cleaner embodiment 400, outer spray manifolds 402, 404, 406, 408, and 410 spray fluid radially inwardly onto and into the boxes or containers 52. Inner liquid spray manifolds 412 spray liquid radially outwardly, onto the back surfaces of the boxes 52. The inner liquid spray manifolds 412 are positioned radially within the spinning rotor 36. The outer spray manifolds 402, 404, 406, 408, and 410, are positioned either within the enclosure 38, as shown in FIG. 14, or are positioned outside of the enclosure 38, with nozzles on the manifolds extending through openings in the enclosure, as shown in FIG. 13.

The inner and outer liquid spray manifolds may also be set up within the box cleaner 400 to spray a gas, such as clean dry air, during a drying cycle. Alternatively, separate inner and/or outer gas spray manifolds may be provided.

Referring to FIGS. 14 and 15, the first outer liquid spray manifold 402 has a plurality of preferably evenly spaced apart spray nozzles 430 and 432. The nozzles 430 are straight spray nozzles which spray out directly towards the spin axis and center C of the rotor 36. The straight spray nozzles 430 may be cone nozzles, which spray out in a cone pattern, encompassing a solid angle of e.g., 10–60° or 15–45°, and preferably about 30°. Alternatively, the straight spray nozzles 430 may be fan type nozzles providing a flatter spray pattern. For better effect in cleaning boxes 52, the nozzles 432 also included on the first manifold 402 are angle spray nozzles. Preferably, the first manifold 402 will have 2 or 4 angle spray nozzles 432, separated by at least one, and preferably several, straight spray nozzles 430.

Figure 16:
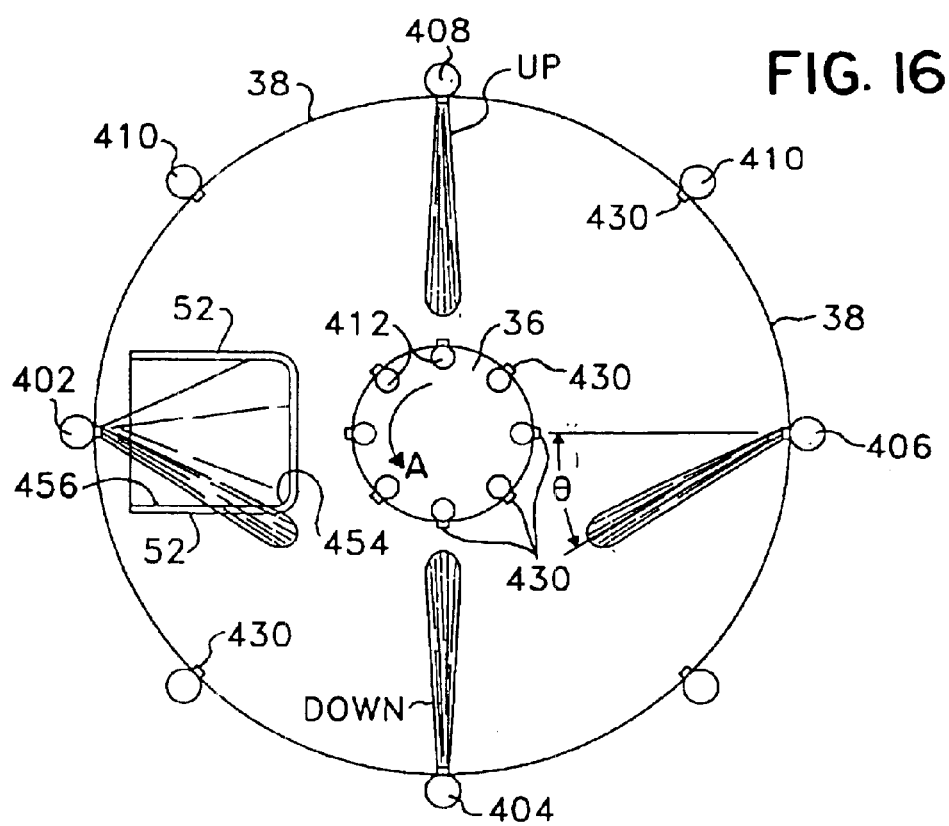

Referring to FIG. 15, the angle spray nozzles 432 on the first outer liquid spray manifold 402 are configured to spray at an angle θ away from an approaching FOUP box or container, or angled in the direction of rotor rotation A. The straight spray nozzles 430 on the first manifold 402 spray directly towards the center C of the rotor assembly 36. The straight spray nozzles 430 on the first manifold 402 clean various surfaces of the box 52, as with existing spray techniques. The angle spray nozzles 432 on the first manifold 402, however, are better configured for cleaning interior corners of the boxes 52, as shown in FIG. 16. If desired, all of the nozzles on the first manifold 402 may be angle spray nozzles 432, oriented to spray at the angle θ shown in FIG. 15. Alternatively, all of the nozzles may be angle spray nozzles 432, but may have different spray angles. However, preferably, the first manifold 402 has 2 or 4 angle spray nozzles 432 with both oriented to spray at angle θ, and with the remaining nozzles being straight spray nozzles 430. Preferably, the first manifold 402 will therefore have 2 or 4 angle spray nozzles 432, and 5 or 7 straight spray nozzles 430, and with all nozzles preferably equally spaced apart. Of course, other numbers and configurations may be used.

Referring to FIGS. 15 and 16, the second outer spray manifold 404 is preferably oriented at about 90° to the first manifold 402, on or in the enclosure or bowl 38. The second manifold 404 has straight spray nozzles 430, which preferably spray out in a direction generally perpendicular to the spray from the straight spray nozzles 430 on the first manifold 402. The second manifold 404 also has at least one, and preferably from 2–4 angle spray nozzles 432 oriented to spray radially inwardly towards the center C, but at a downward angle θ (angled towards the bottom of the rotor or box cleaner 400).

The third outer liquid spray manifold 406 is preferably designed substantially as a mirror image of the first outer liquid spray manifold 402. That is, the third outer liquid spray manifold 406 has straight spray nozzles that spray towards the center C, and also has angle spray nozzles 432 oriented at angle θ toward the approaching box, and opposite to the direction of rotation A.

The fourth outer liquid spray manifold 408 has straight spray nozzles 430 which spray towards the center C, and at least one angle spray nozzle 432 (and preferably 2–4) oriented to spray upwardly at an angle θ (towards the top of the box cleaner 400).

Figure 24:
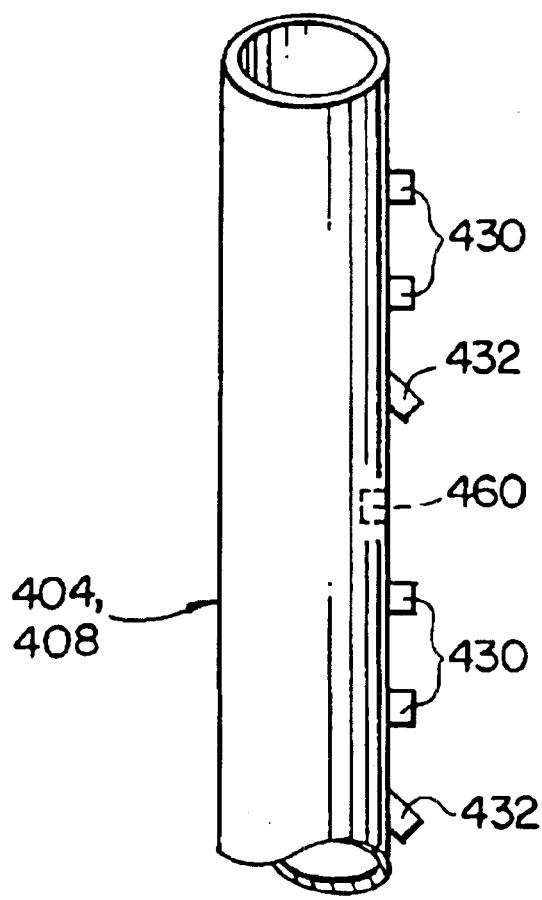
FIG. 24 is a perspective view of a section of an up or down spray manifold.

As shown in FIG. 24 to avoid interfering with adjacent spray nozzles, the downwardly oriented angle spray nozzles 432 on the second outer spray manifold 404, and the upwardly oriented angle spray nozzles 432 on the fourth outer spray manifold 408, are advantageously spaced apart from the next adjacent lower and upper (respectively) straight spray nozzle 430 by a distance sufficient to avoid extensively colliding spray patterns. Consequently, the spacing between the straight spray nozzles 430 and angle spray nozzles 432 on the second and fourth outer spray manifolds 404 and 408 preferably are not equal. In contrast, the spacing between the angle spray nozzles 432 on the first 402 and the third 406 outer spray manifolds, may be, and preferably is, approximately uniform.

The up and down angles of the spray angle nozzles 432 on the fourth 408 and second 404 outer spray manifolds are not necessarily equal to each other or to the angle θ of the angle spray nozzles 432 on the first 402 and the third 406 outer spray manifolds. The angles may be varied with different applications, but preferably all of the angles (right on manifold 402, down on manifold 404, left on manifold 406, and up on manifold 408) are between 10–80, 20–70, 30–50, and more preferably 40–50°. In the embodiment shown, all of the angle spray nozzles are designed to spray at an angle θ of 45°.

The manifolds 402, 404, 406, and 408 are advantageously equally spaced apart at 90° intervals around the perimeter of the inside walls of the chamber 38. Preferably, between each of the manifolds 402, 404, 406 and 408 having angle spray nozzles, is at least one straight spray manifold 410, preferably having only straight spray nozzles 430, as shown in FIG. 15.

The inner spray manifolds 412 preferably all have only straight spray nozzles 430, primarily for cleaning the back surfaces of the boxes 52. However, the inner spray manifolds 412 may also have angle spray nozzles 432, similar to the outer spray manifolds. In the embodiment shown, there is a total of 8 outer spray manifolds, 402, 404, 406, 408 and the 4 outer straight spray manifolds 410. There are also preferably 8 inner liquid spray manifolds, which may be aligned with the outer spray manifolds, as shown in FIG. 15, or which may be offset or staggered vertically. They may also be offset angularly, so that the spray from the inner liquid spray manifolds 412 is aimed at a point in between 2 outer spray manifolds. If desired, the vertical positions of the nozzles 430 and 432 on the outer spray manifolds may be offset or staggered, to provide a wider range of spray coverage.

Figure 23:
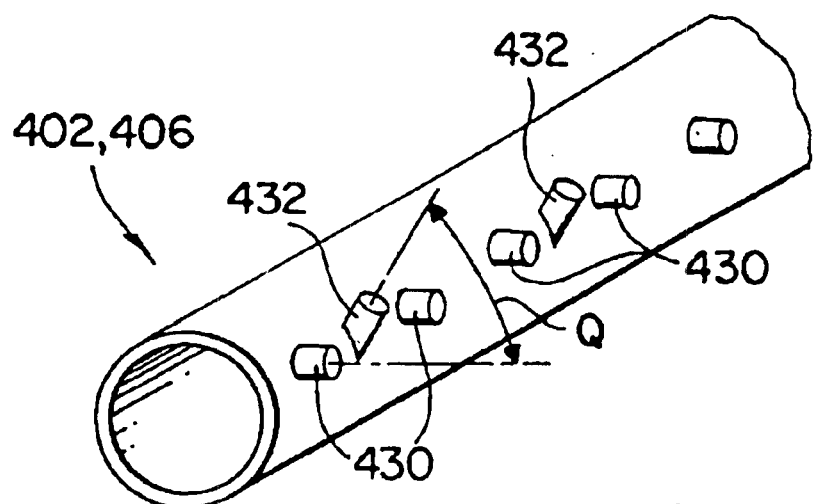
FIG. 23 is a perspective view of a section of a left or right spray manifold.

As shown in FIGS. 21–23 the angle spray nozzles 432 include a guide surface 434 extending over the nozzle outlet 436, to create a conical spray pattern oriented at angle θ to the axis end of the nozzle body 438. When installed, the axis N generally intersects with the center of rotation of the rotor C, while the guide surface 434 causes the spray pattern to extend at the angle θ relative to the axis N.

FIGS. 5–20 show operation of the box cleaner 400, as the rotor turns in direction A carrying a box 52. Cleaning fluid is supplied to all of the manifolds 402, 404, 406, 408, 410 and 412, such that liquid preferably simultaneously sprays out of all nozzles 430 and 432 on all of the manifolds. In FIG. 15, a straight spray from the straight spray nozzles 430 of the manifold 410 reaches and cleans certain side and back interior surfaces of the box 52. As the rotor moves the box 52 into the position shown in FIG. 16, the straight spray nozzles 430 on the manifold 402 preferably spray onto and into the box 52, with a similar pattern and geometry as the straight spray from manifold 410 in FIG. 15. However, the angle spray nozzles 432 on the manifold 402 spray at an angle θ, so that the trailing exterior side surfaces 452 and the leading interior corners 454 and interior side wall 456 are more directly sprayed and cleaned, as shown in FIGS. 15 and 16.

Figure 17:
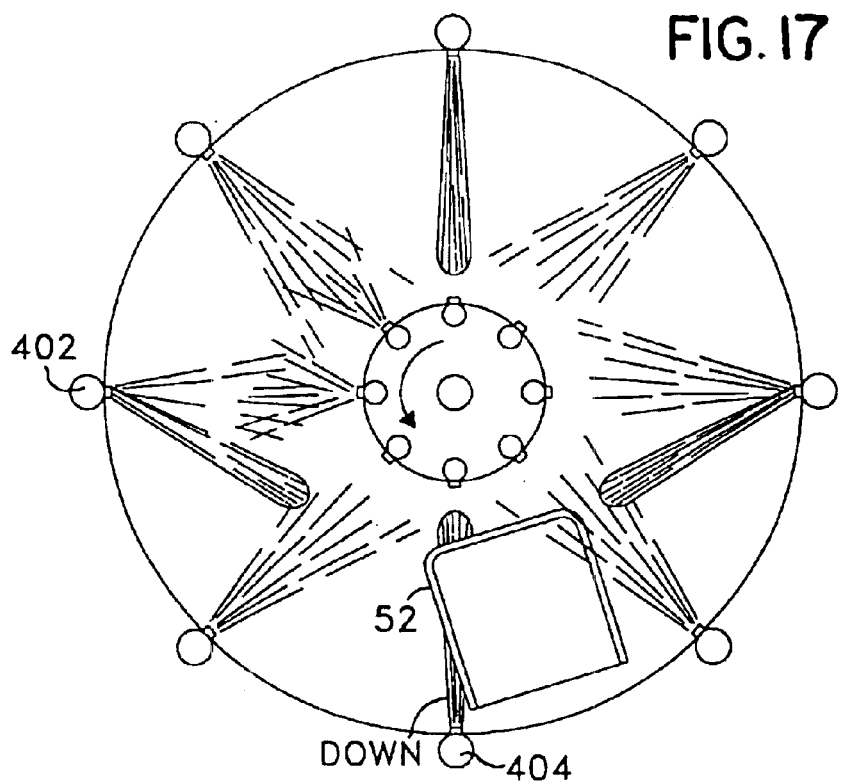

Turning to FIG. 17, when the box 52 rotates into the range of the manifold 404, the straight nozzels 430 on the manifold 404 spray into and onto the box in a way similar to the straight nozzles 430 on the manifolds 410 and 402. However, the angle spray nozzles 432 on the manifold 404 spray down at an angle, thereby better cleaning the up-facing surfaces of the box 52.

Figure 18:
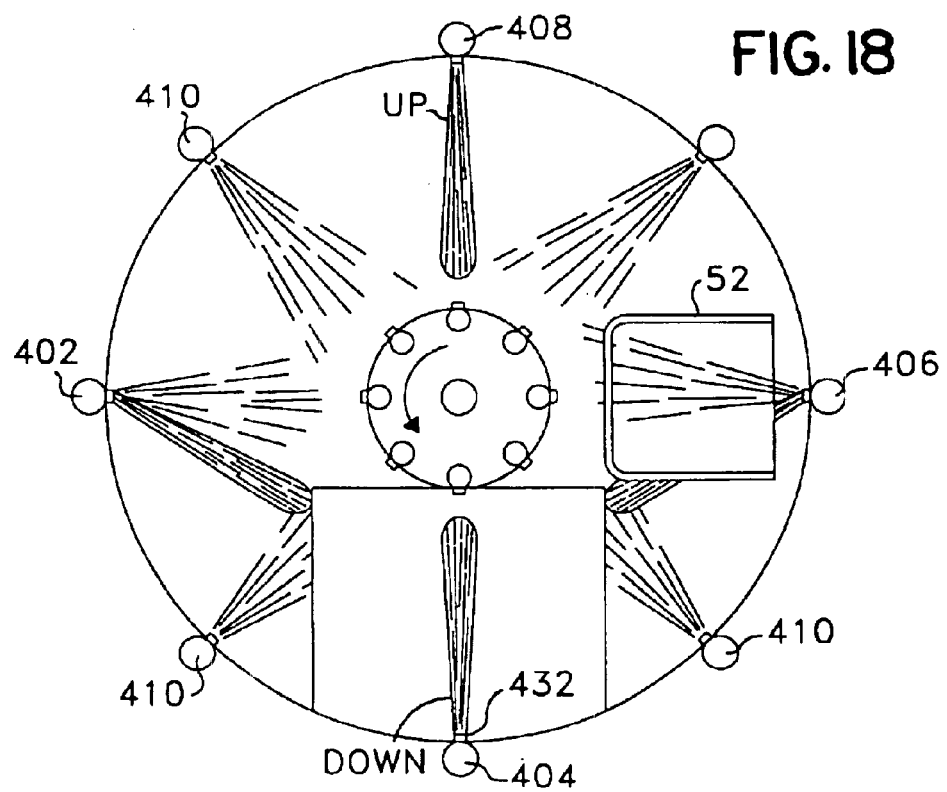

Turning to FIGS. 18, with the rotor spinning, the box 52 moves into the range of the manifold 406. The straight spray nozzles 430 of the manifold 406 spray into and onto the box 52, as described above with respect to the straight spray nozzles 430 on the manifolds 412, 402 and 404. The angle spray nozzles 432 on the manifold 406 spray at an angle minus θ, to better cover and clean the leading exterior side walls and the trailing interior corners of the box 52.

Referring to FIG. 19, as the box 52 moves into the range of the manifold 408, the straight spray nozzles 430 on the manifold 408 spray into and onto the box, as described above. The angle spray nozzles 432 on the manifold 408 spray up, thereby better cleaning the downwardly facing surfaces of the box 52. The rotor typically spins at 200–500 rpm. Generally, after spinning in direction A, the spin direction is reversed. As a result, the leading/trailing relationship of the angle nozzles on manifolds 402 and 406 is also reversed.

For manufacturing efficiency, the manifolds 402–410 may be identical, with the nozzles 430 and 432 then subsequently installed in the left, right, up, or down directions, as described. Consequently, only a single manifold design, and only 2 nozzle designs, are needed, to manufacture all of the manifolds 402, 404, 406, 408 and 410. In this case, the manifold 404 having downwardly spraying nozzles 432, and the manifold 408 having upwardly spraying nozzles 432 can have nozzle holes closed off with a plug 460, to avoid having the up or down angled spray pattern interfere with an adjacent straight spray pattern.

The straight spray nozzles 430 preferably spray out in a solid conical angle of from 15–45°, and preferably about 30°. Preferably, all of the outer spray manifolds have more straight spray nozzles than angle spray nozzles. This provides for cleaning of the rotor itself, as well as the boxes. Using all angle spray nozzles on a manifold tends to diminish the cleaning of the rotor. For rotors having ladders such as ladders 50 which have two box positions, 2, 3, or 4 angle nozzles are preferred on the manifolds 402–408. For ladders having more box positions, more angle nozzles are preferred.

Consequently, by having a spray nozzle on a manifold oriented at an angle toward or away from the direction of rotation, or up or down, improved cleaning is achieved. Of course, straight spray nozzles may be equivalently attached to a manifold, with an angle or offset, or the manifold itself may be angled, so that the nozzles spray out at an angle, to achieve the advantageous results described. The angle spray patterns may also be used in a box cleaner having a rotor which also holds box or FOUP doors, as shown in FIGS. 11 and 12. A manifold 402–408 may also have at least one angle spray nozzle spraying in a plus θ direction, as well as at least one angle spray nozzle spraying in a minus θ direction (on the same manifold).

Thus, novel container cleaning systems and methods have been shown and described. Various modifications and substitutions of equivalents may, of course, be made without departing from the spirit and scope of the invention. The invention, therefore, should not be restricted, except by the following claims, and their equivalents.

What is claimed is:

1. A cleaning system for cleaning boxes used for moving and storing semiconductor wafers, comprising:
    an enclosure;
    a rotor rotatably supported within the enclosure, with the rotor having box positions for holding a box;
    a plurality of spray manifolds positioned to spray a cleaning or rinsing fluid towards the rotor, with at least one of the spray manifolds having a plurality of straight spray nozzles, and also having at least one angle spray nozzle.

2. The cleaning system of claim 1 where the angle is from 30–60 degrees.

3. A method for cleaning five sided boxes used for carrying and storing semiconductor wafers, comprising the steps of:
    placing the boxes in or on a rotor with an open side of the box facing radially outwardly and away from a center of the rotor;
    spinning the rotor holding the boxes;
    spraying a first spray of a cleaning liquid towards the center or spin axis of the rotor to clean the boxes on the rotor; and
    spraying a second spray of the cleaning liquid at an angle relative to the first spray to clean the boxes on the rotor.

4. The method of claim 3 where the center axis of the first spray is aimed at the center of the rotor, and the centerline of the second spray is aimed at an angle to the first spray, so that the second spray sprays a pattern of liquid in a direction towards or opposite to the spin direction of the rotor.

5. A cleaning system for cleaning boxes used for moving and storing semiconductor wafers, comprising:
    an enclosure;
    a rotor rotatably supported within the enclosure, with the rotor having box positions for holding a box;
    a plurality of spray manifolds positioned to spray a cleaning or rinsing fluid towards the rotor, with at least one of the spray manifolds having a plurality of straight spray nozzles, and also having at least one angle spray nozzle, wherein the straight spray nozzles spray in a pattern having a horizontal central axis, and the angle spray nozzle sprays in a pattern having a central axis extending upwardly or downwardly at an angle relative to the horizontal central axis.

6. A cleaning system for cleaning boxes used for moving and storing semiconductor wafers, comprising:
    an enclosure;
    a rotor rotatably supported within the enclosure, with the rotor having box positions for holding a box;
    a plurality of spray manifolds positioned to spray a cleaning or rinsing fluid towards the rotor, with at least one of the spray manifolds having a plurality of straight spray nozzles, and also having at least one angle spray nozzle, wherein the angle spray nozzle is oriented to spray in a pattern having a central axis directed opposite to the direction of rotation of the rotor.

7. A cleaning system for cleaning boxes used for moving and storing semiconductor wafers, comprising:
    an enclosure;
    a rotor rotatably supported within the enclosure, with the rotor having box positions for holding a box;
    a plurality of spray manifolds positioned to spray a cleaning or rinsing fluid towards the rotor, with at least one of the spray manifolds having a plurality of straight spray nozzles and two angle nozzles separated by at least two straight spray nozzles.

8. A method for cleaning five sided boxes used for carrying and storing semiconductor wafers, comprising the steps of:
    placing the boxes in or on a rotor with an open side of the box facing radially outwardly and away from a center of the rotor;
    spinning the rotor holding the boxes;
    spraying a first spray of a cleaning liquid towards the center or spin axis of the rotor to clean the boxes on the rotor; and
    spraying a second spray of the cleaning liquid at an angle relative to the first spray to clean the boxes on the rotor;
    where the first spray is sprayed in a pattern having a centerline or center axis which is horizontal, and where the second spray is also sprayed in a pattern having a centerline which is horizontal.

9. A method for cleaning five sided boxes used for carrying and storing semiconductor wafers, comprising the steps of:
    placing the boxes in or on a rotor with an open side of the box facing radially outwardly and away from a center of the rotor;
    spinning the rotor holding the boxes;
    spraying a first spray of a cleaning liquid towards the center or spin axis of the rotor to clean the boxes on the rotor; and
    spraying a second spray of the cleaning liquid at an angle relative to the first spray to clean the boxes on the rotor, with the first spray oriented horizontally and the second spray oriented upwardly or downwardly at an angle relative to the first spray.

10. A cleaning system for cleaning boxes used for moving and storing semiconductor wafers, comprising:
an enclosure;
a rotor rotatably supported within the enclosure, with the rotor having box positions for holding a box;
a plurality of spray manifolds positioned to spray a cleaning or rinsing fluid towards the rotor, with at least one of the spray manifolds having one or more first spray nozzles, and also having one or more second spray nozzles, with the second spray nozzles at an angle of 10–80 degrees to the first spray nozzles.

11. A method for cleaning boxes used for carrying and storing semiconductor wafers, comprising the steps of:
placing the boxes in or on a rotor;
spinning the rotor holding the boxes;
spraying a first spray of a liquid from a first set of nozzles on a manifold in a first direction towards the boxes to clean the boxes; and
spraying a second spray of the liquid from a second set of nozzles on the manifold in a second direction different from the first direction to clean the boxes.

12. A cleaning system for cleaning boxes used for holding wafers, comprising:
an enclosure;
a rotor within the enclosure for holding boxes radially about a spin axis of the rotor;
a plurality of spray manifolds positioned to spray fluid towards the rotor, wherein at least one of the spray manifolds includes one or more angle spray nozzles directed to spray fluid toward at least one of a leading interior side surface and a trailing interior side surface of a box on the rotor.

13. The cleaning system of claim 12 wherein the at least one spray manifold includes a plurality of angle spray nozzles, with each of the angle spray nozzles oriented at the same angle.

14. The cleaning system of claim 12 wherein the at least one spray manifold includes at least two angle spray nozzles oriented at different angles.

15. The cleaning system of claim 12 wherein the angle spray nozzle is oriented to spray fluid in a pattern having a central axis extending upwardly or downwardly relative to a horizontal axis.

16. The cleaning system of claim 12 wherein the angle spray nozzle is oriented to spray fluid in a pattern having a central axis directed opposite to a direction of rotation of the rotor.

17. The cleaning system of claim 12 wherein at least one of the spray manifolds includes a straight spray nozzle.

18. The cleaning system of claim 12 wherein the at least one spray manifold has two or more straight spray nozzles between two angle spray nozzles.

19. The cleaning system of claim 12 wherein at least one of the angle spray nozzles is directed to spray fluid toward the leading interior side surface of the box, and at least one of the angle spray nozzles is directed to spray fluid toward the trailing interior side surface of the box.

20. A cleaning system for cleaning boxes used for holding wafers, comprising:
an enclosure;
a rotor within the enclosure, with the rotor having a plurality of box holder assemblies for holding boxes; and
spray means for spraying a cleaning or rinsing fluid towards the rotor, with the spray means including an angle spray nozzle directed to spray fluid toward or away from a direction of rotation of the rotor.

21. A cleaning system for cleaning boxes used for holding wafers, comprising:
an enclosure;
a rotor within the enclosure, for holding boxes;
a plurality of spray nozzles positioned to spray fluid towards the rotor, with at least one of the spray nozzles comprising an angle spray nozzle directed to spray fluid toward an up facing surface or a down facing surface of a box on the rotor.

22. The cleaning system of claim 21 wherein the boxes are held in the rotor at positions spaced apart from a spin axis of the rotor, so that the boxes revolve around the spin axis.

23. The cleaning system of claim 21 wherein the angle spray nozzle is oriented to spray fluid in a pattern having a central axis directed opposite to a direction of rotation of the rotor.

24. A cleaning system for cleaning boxes used for holding wafers, comprising:
an enclosure;
a rotor within the enclosure, with the rotor having a box position for holding a box; and
spray means for spraying a cleaning or rinsing fluid towards the rotor, with the spray means including an angle spray nozzle and a straight spray nozzle.

25. A cleaning system for cleaning boxes used for holding wafers, comprising:
an enclosure;
a rotor within the enclosure, for holding boxes;
a plurality of spray nozzles positioned to spray fluid towards the rotor, with at least one of the spray nozzles comprising an angle spray nozzle, and at least one of the spray nozzles comprising a straight spray nozzle.

26. A cleaning system for cleaning boxes used for holding wafers, comprising:
an enclosure;
a rotor within the enclosure, for holding boxes;
a plurality of spray nozzles positioned to spray fluid towards the rotor, with at least one of the spray nozzles comprising an angle spray nozzle directed to spray fluid toward at least one of an upper section and a lower section of the rotor.

27. The cleaning system of claim 26 wherein at least one of the spray nozzles comprises a second angle spray nozzle directed to spray fluid toward or away from a spin direction of the rotor.

28. The cleaning system of claim 27 wherein the angle spray nozzle is directed to spray fluid toward an interior corner of a box held on the rotor.

29. A cleaning system for cleaning boxes used for holding wafers, comprising:
a rotor having a box position for holding a box; and
one or more first spray nozzles, and one or more second spray nozzles, for spraying a fluid towards the rotor, and with at least one of the first spray nozzles at an angle of 10–80 degrees to one of the second spray nozzles.

* * * * *